United States Patent
Gandhi et al.

(10) Patent No.: US 11,658,572 B2
(45) Date of Patent: May 23, 2023

(54) POWER FIELD EFFECT TRANSISTOR TOPOLOGY AND BOOTSTRAP CIRCUIT FOR INVERTING BUCK-BOOST DC-DC CONVERTER

(71) Applicant: Intel Corporation, Santa Clara, CA (US)

(72) Inventors: Nikunj Gandhi, Ahmedabad (IN); Gaurav Garg, Bangalore (IN); Apratim Chatterjee, West Bengal (IN); Shobhit Tyagi, Ghaziabad (IN); Sudhir Polarouthu, Bengaluru (IN); Guruvara Nanda Kishore Mutchakarla, Vishakhapatanam (IN)

(73) Assignee: Intel Corporation, Santa Clara, CA (US)

( * ) Notice: Subject to any disclaimer, the term of this patent is extended or adjusted under 35 U.S.C. 154(b) by 186 days.

(21) Appl. No.: 17/124,359

(22) Filed: Dec. 16, 2020

(65) Prior Publication Data
US 2021/0391795 A1 Dec. 16, 2021

(30) Foreign Application Priority Data
Jun. 11, 2020 (IN) .............................. 202041024490

(51) Int. Cl.
*H02M 1/08* (2006.01)
*H02M 3/158* (2006.01)
*G11C 13/00* (2006.01)

(52) U.S. Cl.
CPC ....... *H02M 3/1582* (2013.01); *G11C 13/0038* (2013.01); *H02M 1/08* (2013.01)

(58) Field of Classification Search
CPC .... G11C 13/0038; H02M 1/08; H02M 3/1582
USPC .......................... 323/271, 282, 283; 327/589
See application file for complete search history.

(56) References Cited

U.S. PATENT DOCUMENTS

| 9,136,836 B2 | 9/2015 | Chen et al. |
| 9,419,509 B2 | 8/2016 | Jarvinen et al. |
| 2013/0127371 A1* | 5/2013 | Sarig ...................... H02M 1/08 315/307 |

(Continued)

OTHER PUBLICATIONS

Office Action dated Mar. 14, 2022 for Indian Application No. 202041024490, 6 pages.

*Primary Examiner* — William Hernandez
(74) *Attorney, Agent, or Firm* — Schwabe, Williamson & Wyatt, P.C.

(57) ABSTRACT

For a buck-boost DC-DC converter with n-type high-side field effect transistor (HSFET), a supply is derived from input and output rails, and this supply maintains a constant differential voltage independent of input supply voltage. The derived supply is used as the high supply (HS) of an HSFET Driver. As such, the HSFET resistance becomes independent of supply variation. A wide range ultra-low IQ (Quiescent current), edge triggered level-shifter provides support to a bootstrapped power stage of the inverting buck-boost DC-DC converter. When p-type HSFET is used, a supply is derived from the input and output supply rails, and this derived supply maintains a constant differential voltage independent to the input supply voltage. The derived supply is used as the low supply (LS) or 'ground' of the HSFET Driver. As such, the p-type HSFET resistance becomes independent of supply variation.

20 Claims, 18 Drawing Sheets

(56) References Cited

U.S. PATENT DOCUMENTS

2014/0159680 A1* 6/2014 Chiu ...................... G05F 1/468
323/271
2021/0126538 A1* 4/2021 Puia ...................... H02M 3/158
2021/0184576 A1* 6/2021 Cattani ............... H02M 3/1582

* cited by examiner

POWER FIELD EFFECT TRANSISTOR TOPOLOGY AND BOOTSTRAP CIRCUIT FOR INVERTING BUCK-BOOST DC-DC CONVERTER

CLAIM FOR PRIORITY

This application is a continuation of, and claims the benefit of priority to Indian Patent Application No. 202041024490, filed on Jun. 11, 2020, titled "Power Field Effect Transistor Topology and Bootstrap Circuit for Inverting Buck-Boost DC-DC Converter", and which is incorporated by reference in entirety.

BACKGROUND

Inverting buck-boost DC-DC converter comprises an n-type high-side field effect transistor (HSFET) switch which requires a bootstrap circuit to supply corresponding high-side driver(s) to ensure correct n-type HSFET switch operation. Conventional bootstrap circuit fails to work reliably when a wide input supply (e.g., 1.9 V to 5.5 V) and output voltage (e.g., 0 V to −6 V) range of the inverting buck-boost DC-DC converter is considered.

When an inverting buck-boost DC-DC converter comprises a p-type HSFET, the p-type HSFET becomes highly resistive (e.g., when an input supply is less than 3 V). To compensate for this high resistance, the size of the p-type HSFET is increased (e.g., the width is increased) to support full loading conditions. When input power supply varies highly (e.g., 2 V to 5.5 V), both high resistance and/or large size for the p-type HSFET make the inverting buck-boost DC-DC converter uncompetitive.

When an inverting buck-boost DC-DC converter comprises an n-type HSFET, the bootstrap circuit causes signals for HSFET driver to be level-shifted to a floating domain—between bootstrap supply VBoot and inductor voltage, Vlx (or simply Lx). For an inverting buck-boost DC-DC converter, the wide range of input output voltages makes the level-shifting complex. For example, for an input power supply Vin of about 1.9 V to 5.5 V, output power supply Vout of about −3 V to −6 V, and with gate drive (e.g., voltage of Bootstrap capacitance) maintained at 4 V, level-shifting is expected to take care of following cases of voltage domain transitions: First case, maximum Vlx (LX) swing is −6 V to 5.5 V and for VBoot is −2 V to 9.5 V; Second case, minimum Vlx swing is −2 V to 1.9 V and for VBoot is 2 V to 5.9 V; and Third case, Vlx swing is 0 V to 1.9 V and for VBoot is 0 V to 3.8 V for startup. To support high voltage without reliability concerns, either cascode devices or clamps are used for protection but both have disadvantages associated with them. For example, cascode devices cannot support low supply voltage because of headroom issues while clamps leak constantly making it high power level-shifter.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
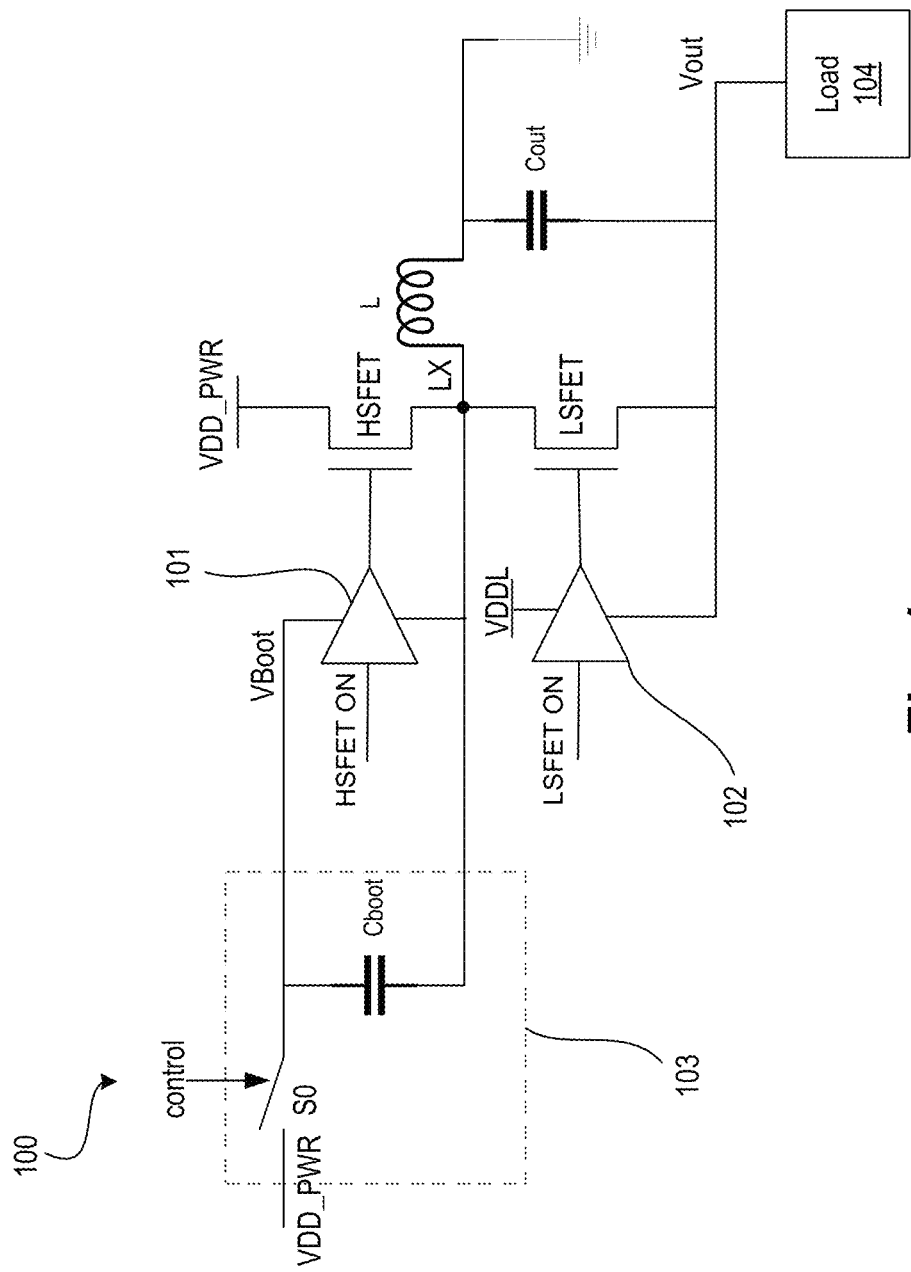
FIG. 1 illustrates a portion of an inverting DC-DC converter with a bootstrap circuit that overstresses an n-type high-side field effect transistor switch (HSFET).

Various embodiments improve reliability of an n-type high-side field effect transistor switch (HSFET) for an inverting DC-DC converter. In some embodiments, a derivative supply voltage (VDDL) is generated and provided to a switch of a bootstrap circuitry instead of an input power supply rail VDD_PWR or Vin. As such, a VBoot supply level remains constant irrespective of the output voltage Vout and VDD_PWR operating conditions, where VBoot supply level is provided to the HSFET driver. The derivative supply voltage VDDL becomes positive and negative during startup and steady-state conditions, respectively. Hence, dynamic biasing inside the switch ensures no reliability issues under all operating conditions.

In some embodiments, constant ON resistance is provided to the HSFET and an n-type low-side field effect transistor (LSFET) switch. The derivative supply voltage VDDL from the output supply voltage Vout causes a constant $V_{GS}$ level of the power-FETs (HSFET and LSFET) across all the input and output conditions. Hence, the power-FETs are optimized further by keeping the $V_{GS}$ level constant considering best in class efficiency and area. In some embodiments, the $V_{GS}$ level of the power-FETs can be programmed on the fly in different modes like pulse width modulation (PWM) and pulse frequency modulation (PFM) to boost efficiency further.

The bootstrap circuit of various embodiments increases the overall efficiency of the converter and reduces the overall silicon estate. Inverting buck-boost DC-DC regulators are getting popular in many segments such as a memory, display panels for smart phones and cameras and many more. While the various embodiments are discussed with reference to using the inverting buck-boost DC-DC converter for a three-dimensional cross-point memory (3D X-point memory) system, similar principle(s) are applicable to buck-boost DC-DC converters for display panels for smart phones, cameras, etc. Other technical effects will be evident from the various figures and embodiments. Other technical effects will be evident from the various figures and embodiments.

When p-type transistor is used for HSFET, bootstrap circuit 103 may not be used. However, p-type HSFET occupies more area and hence power. At gate drive voltages below 3 V, for example, the turn-on resistance of the Power-FETs (both n-type and p-type) increase exponentially. High turn-on resistance means there will be a sharp degradation of efficiency at lower gate drive.

Some embodiments describe an architecture where a supply (voltage and/or current) is derived from input and output supply rails, and this supply maintains a constant differential voltage with respect to input supply voltage. The derived supply is used as the Low supply (LS) or ground of an HSFET driver. As such, the HSFET resistance becomes independent of supply variation.

There are many technical effects for providing constant (or substantially constant) gate drive topology for p-type HSFET in inverting buck-boost DC-DC converters. For example, in a 3D X-point memory unit, two operations are supported: read, write. For some class of memories, programming operations (e.g., writes) are performed with positive voltage and erase operations are either done with higher voltages or by using negative voltages. Using negative voltage has multiple advantages compared to using a higher positive voltage. The negative voltage approach minimizes current drawn from the erase (HV) regulator thus saving silicon real estate, improves the retention time and refresh periods, hence, contributing to the longtime reliability of memory cells. By using this technique, the product efficiency increases at nominal condition without compromising the load regulation specification at full load condition. Other technical effects will be evident from the various figures and embodiments.

To support an n-type HSI-ET, bootstrap circuit is typically used which maintains enough $V_{GS}$ for the n-type HSFET when switch node LX, goes to Vin (e.g., battery voltage, VDD_PWR). With the bootstrap circuit in place, the control signals for HSFET driver are level-shifted to a floating domain between Vboot and Vlx (voltage on LX). For an inverting buck-boost DC-DC converter, this introduces a wide range of input output voltages making this level-shifting complex. For example, for Vin approximately 1.9 V to 5.5 V, Vout is approximately −3 V to −6 V, with gate drive (Voltage of Bootstrap capacitor Cboot) maintained at 4 V, level-shifting is to take care of following cases. In the first case, the level-shifter is to handle maximum voltage Vlx swing on LX node of −6V to 5.5 V, and for VBoot −2 V to 9.5 V. In the second case, the level-shifter is to handle a minimum voltage Vlx swing on LX node of −2 V to 1.9 V and for Vboot 2 V to 5.9 V. In the third case, the level-shifter is expected to support Vlx swings of 0 V to 1.9 V and for Vboot 0 V to 3.8 V for startup. One way to support high-voltage without reliability concern is to either use cascode devices or clamps. Cascode devices cannot support low supply voltages because of headroom issues. Clamps, on the other hand, constantly leak making them high power level-shifters.

Some embodiments disclose a wide range ultra-low IQ (Quiescent current), edge triggered level-shifter to support boot-strapped power stage of the inverting buck-boost DC-DC converter. In one example, the level-shifter supports a Vin range of 1.9 volt to 5.5 volt and Vout range of 0 volt (during start up) to −6 volt (steady state max Vout support). In some embodiments, the level-shifter is a multi-stage level-shifter switch a pulse-based edge-triggered scheme to eliminate static current as the circuit remains active for a limited duration (e.g., time for setting/resetting a latch). To avoid duty cycle distortion caused by the headroom limitation at low differential voltages, the level-shifter is designed without any cross-coupled structure in high voltage domain (e.g., greater than 5V) and this also eliminates the use for cascode protection. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "analog signal" here generally refers to any continuous signal for which the time varying feature (variable) of the signal is a representation of some other time varying quantity, i.e., analogous to another time varying signal.

The term "digital signal" is a physical signal that is a representation of a sequence of discrete values (a quantified discrete-time signal), for example of an arbitrary bit stream, or of a digitized (sampled and analog-to-digital converted) analog signal.

The term "scaling" generally refers to converting a design (schematic and layout) from one process technology to another process technology and may be subsequently being reduced in layout area. In some cases, scaling also refers to upsizing a design from one process technology to another process technology and may be subsequently increasing layout area. The term "scaling" generally also refers to downsizing or upsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions.

It is pointed out that those elements of the figures having the same reference numbers (or names) as the elements of any other figure can operate or function in any manner similar to that described but are not limited to such.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

FIG. 1 illustrates a portion of an inverting DC-DC converter 100 with a bootstrap circuit that overstresses an n-type HSFET. Converter 100 comprises n-type HSFET, n-type low-side field effect transistor switch (LSFET), HSFET driver 101, LSFET 102, bootstrap circuit 103, inductor L, and load capacitor Cout. n-type HSFET is also referred to as an n-type high-side switch. n-type LSFET is also referred to as an n-type low-side switch. One terminal of the inductor L is coupled to ground. The other terminal of the inductor is coupled to node LX. Node LX is a supply rail coupled to driver 101, HSFET, LSFET, and bootstrap capacitor Cboot. The voltage on supply rail LX is Vlx or simply LX. Bootstrap circuit 103 comprises capacitor Cboot coupled to VBoot supply rail and LX supply rail. A controllable switch S0 (e.g., implemented as one or more transistors) is controlled by a control signal. The control signal may be generated by a controller (not shown) that applies a modulation scheme such as pulse width modulation (PWM), pulse frequency modulation (PFM), etc. The switch couples VDD_PWR supply rail and VBoot supply rail. Here, node names and signal names are interchangeably used. For example, control may refer to a control signal or a control node depending on the context of the sentence.

HSFET driver 101 is powered by VBoot while its low reference supply is coupled to LX instead of ground VSS. HSFET driver 101 drives HSFET ON signal to turn on the HSFET. HSFET ON signal is generated by a controller (not shown). LSFET driver 102 is powered by VDDL while its low reference supply for LSFET driver 102 is coupled to Vout supply rail instead of ground VSS. LSFET driver 102 drives LSFET ON signal to turn on the LSFET. LSFET ON signal is generated by a controller (not shown). The output supply rail Vout is coupled to load 104, such as a 3D X-point memory. However, load 104 is not limited to a 3D X-point memory. Any suitable load can be used.

Bootstrap circuit 103 fails to work reliably when the wide input supply VDD_PWR range (e.g., 1.9 V to 5.5 V) and the output voltage Vout (e.g., 0 to −6 V) range of the inverting buck-boost DC-DC converter 100 is considered. In these conditions, VBoot voltage can vary from Vout+$\Delta V_{GS}$ (e.g., −2V) to VDD_PWR+$\Delta V_{GS}$ (e.g., 9.5V). Switch S0 of bootstrap circuit 103 is typically a transistor on a standard CMOS process where the substrate (or substrate terminal) is connected to ground, and that results in parasitic diodes of the transistor becoming forward biased.

The Cboot capacitor is charged when the LSFET is ON and the HSFET is OFF. In a first phase, current flows from VDD_PWR and Cboot capacitor is charged based on a difference between the voltages of VDD_PWR and Vout. In a second phase, when the LSFET is turned off and the HSFET is turned on, the LX node charges towards VDD_PWR which raises the bootstrap voltage VBoot above VDD_PWR voltage.

The Power-FETs (HSFET/LSFET) are implemented as high voltage (HV) devices that can sustain high drain-to-source voltage Vds (e.g., 12 V) voltages but its maximum allowable $V_{GS}$ (gate-to-source voltage) rating is typically same as a low voltage (LV) transistor (e.g., 5.5V). For a wide input-output operating conditions, the $\Delta$VBoot level may exceed an allowable $V_{GS}$ rating of the HSI-ET for certain input and output voltages. This can cause device reliability issues, resulting in transistor breakdown.

The VBoot level is very sensitive to the voltage levels of VDD_PWR and Vout, which can cause a reliability issue for the HV operating conditions. For example, if VDD_PWR is at 5.5 V and Vout is at −6 V; $\Delta$VBoot level is at 11.5 V, which may exceed an allowable $V_{GS}$ rating of the HSFET. $\Delta$VBoot level varies with the VDD_PWR causing on-resistance of the HSFET to vary with different operating conditions. Therefore, optimizing the HSFET size for the lower VDD_PWR is desired. Most of the time, designers over design HSFET size to meet the specification at the lower VDD_PWR. Hence, the size of the HSFET increases to accommodate the low VDD_PWR specifications, and this causes lower efficiency and overall higher area of the DC-DC converter.

Figure 2:
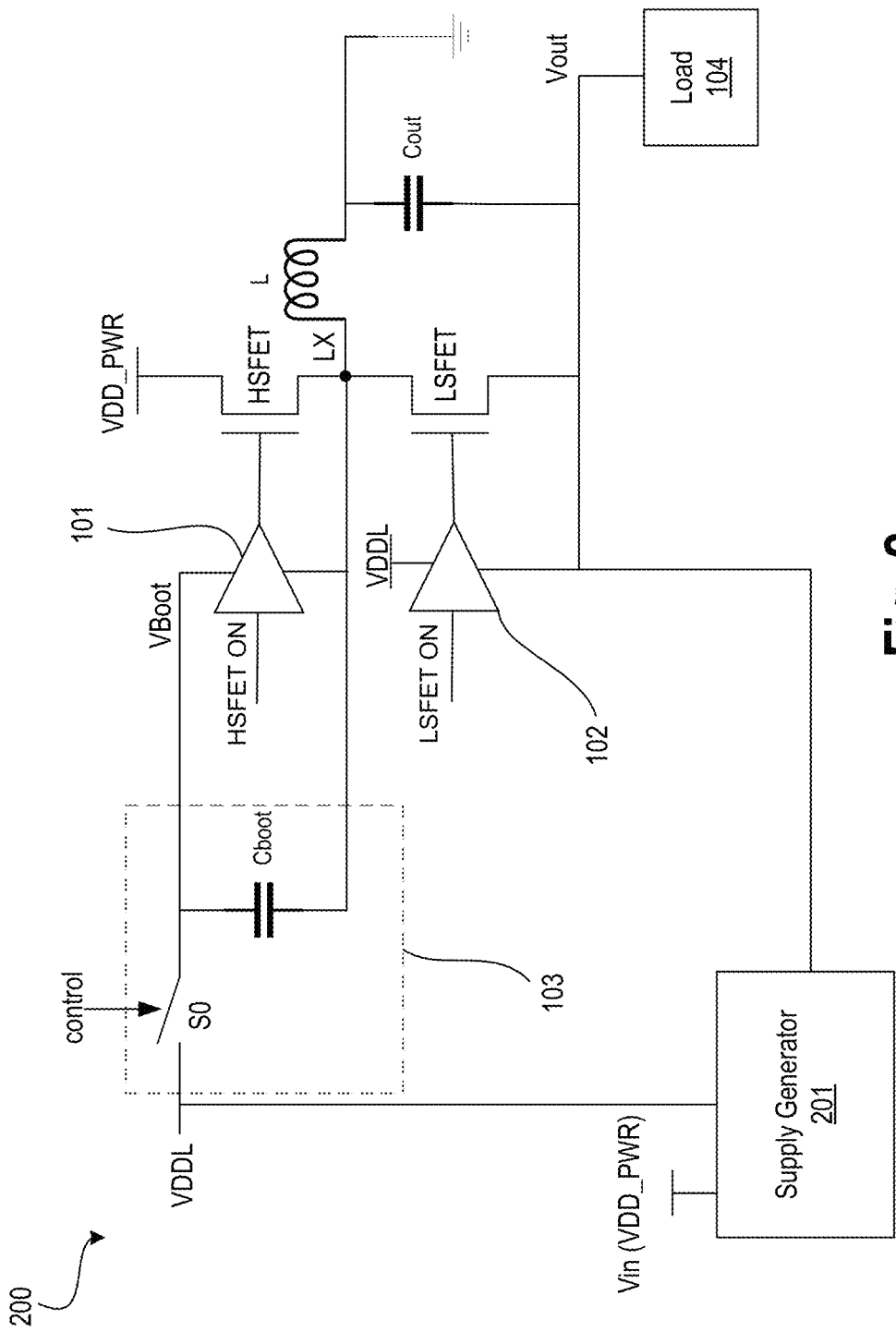
FIG. 2 illustrates a portion of an inverting DC-DC converter with bootstrap circuit that generates constant gate-to-source voltage ($V_{GS}$) across the n-type HSFET, in accordance with some embodiments.

FIG. 2 illustrates a portion of an inverting DC-DC converter 200 with bootstrap circuit that generates constant gate-to-source voltage ($V_{GS}$) across the n-type HSFET, in accordance with some embodiments. Various embodiments improve reliability of the HSFET by providing a derivative supply voltage (VDDL) to switch S0 instead of VDD_PWR. As such, the VBoot level remains constant irrespective of Vout and VDD_PWR operating conditions. VDDL is generated by a supply generator 201 that receives input supply Vin or VDD_PWR and produces an output supply VDDL. In various embodiments, the derivative supply voltage VDDL becomes positive and negative during startup and steady-state conditions, respectively. Hence, dynamic biasing inside switch S0 ensures no reliability issues under all operating conditions.

In some embodiments, a constant ON resistance is provided to the HSFET and the LSFET. The derivative supply voltage VDDL from Vout causes a constant $V_{GS}$ level of the power-FETs (HSFET and/or LSFET) across all the input and output conditions. Hence, the power-FETs are optimized further by keeping the $V_{GS}$ level constant considering best in class efficiency and area. In some embodiments, the $V_{GS}$ level of the power-FETs can be programmed on the fly (e.g., adaptively or dynamically) in different modes like pulse width modulation (PWM) and pulse frequency modulation (PFM) to boost efficiency further. For example, the $V_{GS}$ level can be adjusted or modified, during operation of the DC-DC converter, via hardware knobs (e.g., registers) or software and/or firmware.

In bootstrap architecture 103 of FIG. 1, VBoot level is very sensitive to the voltage levels of VDD_PWR and Vout. This can cause a reliability issue for the HV operating conditions (e.g., if VDD_PWR is at 5.5 V and VOUT is at −6 V; VBoot level is at 11.5 V, which exceeds the allowable $V_{GS}$ rating of the HSFET). The improved bootstrap circuit 103 of FIG. 2 uses a derivative supply VDDL instead of the VDD_PWR to generate constant $V_{GS}$ across HS Power-FET. In some embodiments, the VDDL can be generated by a reference generator 201 which tracks the Vout with constant $V_{GS}$ or can be realized using LDO 201 (Low Drop out Regulator) architecture. In one example, VDDL is set 4 V above Vout (ΔVDDL=4V). The ΔVDDL level is programmable and user can program different values based on modes of operations (e.g., PWM/PFM) to boost efficiency. For example, VDDL is set×V above Vout, where 'x' is any number. For the 3D X-point example, a range of steady-state conditions are shown in Table 1 for the improved bootstrap architecture of FIG. 2.

TABLE 1

| Switch | VDDL (V) | | Vout (V) | | VBoot (V) | | VDD_PWR (V) | |
| --- | --- | --- | --- | --- | --- | --- | --- | --- |
| S0 | Min | Max | Min | Max | Min | Max | Min | Max |
| ON | −2 | 1 | −6 | −3 | −2 | 1 | 1.9 | 5.5 |
| OFF | −2 | 1 | −6 | −3 | 5.9 | 9.5 | 1.9 | 5.5 |

Figure 3:
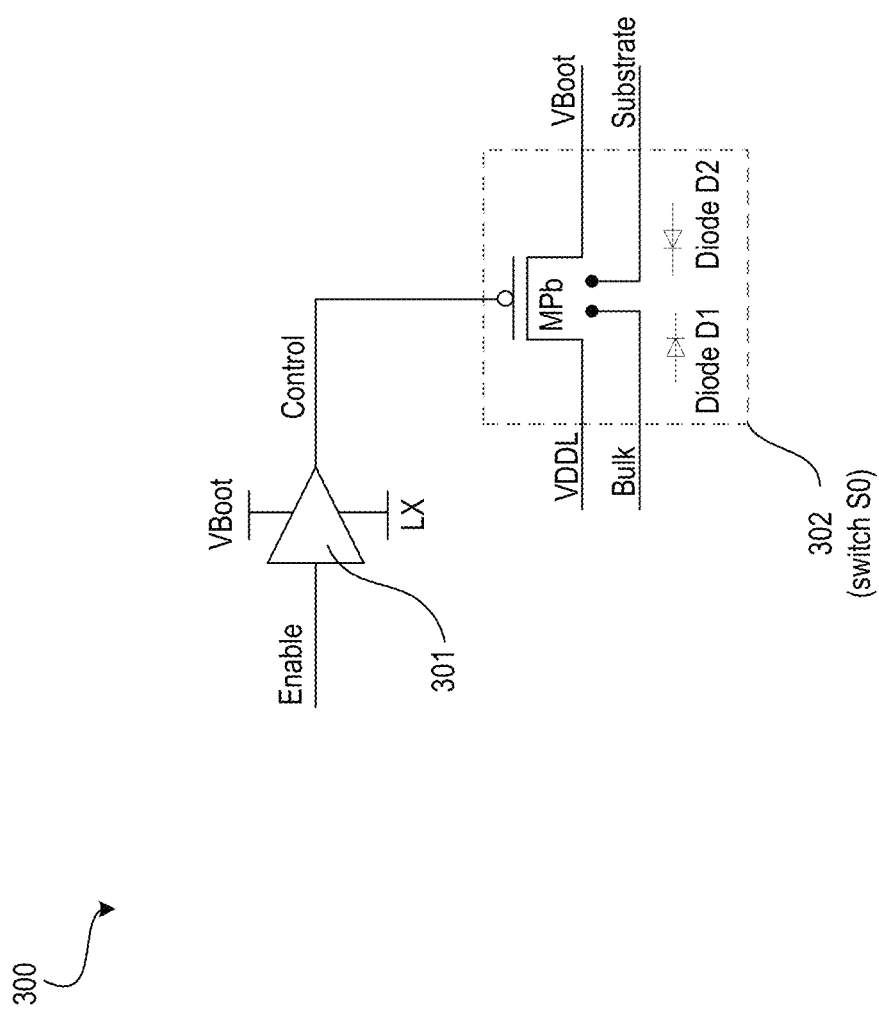
FIG. 3 illustrates a bootstrap switch in the bootstrap circuit, where the bootstrap switch may cause a forward bias bulk-to-substrate diode.

FIG. 3 illustrates apparatus 300 with bootstrap switch S0 302 in the bootstrap circuit 103, where the bootstrap switch may cause a forward bias bulk-to-substrate diode. The bootstrap switch (S0) 302 can be realized using a five terminal transistor (e.g., p-type switch MPb). The five terminals of the transistor are gate, source, drain, bulk, and substrate terminals. The gate terminal is controlled by Control generated by driver 301. Driver 301 may receive an input Enable from a controller (not shown). Driver 301 (e.g., a buffer) is powered by VBoot where the low reference supply is LX. As such, Control can toggle between VBoot and LX.

In a typical bootstrap circuit, the bulk terminal (NWELL) is always connected to Vboot supply rail. Since the bulk terminal (NWELL) is positive during both the phases (S0 being on, and S0 being off), ensures bulk-to-substrate diode D1/D2 is not forward biased. The VBoot level can be negative when bootstrap switch (S0) is on. In this case, the bulk terminal (NWELL) is connected to a negative voltage level, which causes the bulk-to-substrate diode D1/D2 forward biased. To prevent any parasitic diodes of the p-type transistor switch (S0) getting forward biased, dynamic bulk biasing is used, in accordance with some embodiments.

Figure 4:
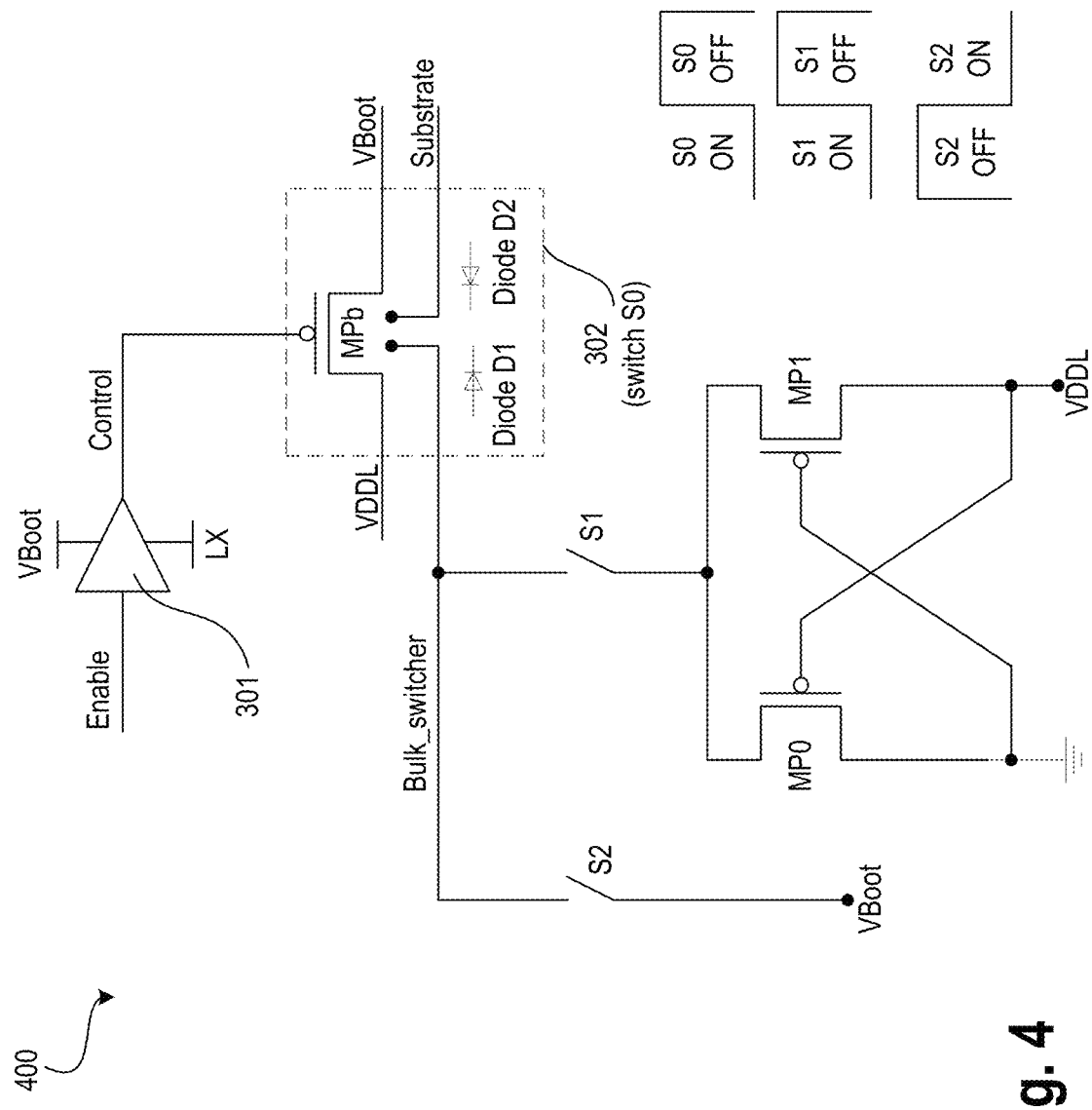
FIG. 4 illustrates a bootstrap switch with dynamic bulk biasing, in accordance with some embodiments.
Figure 5:
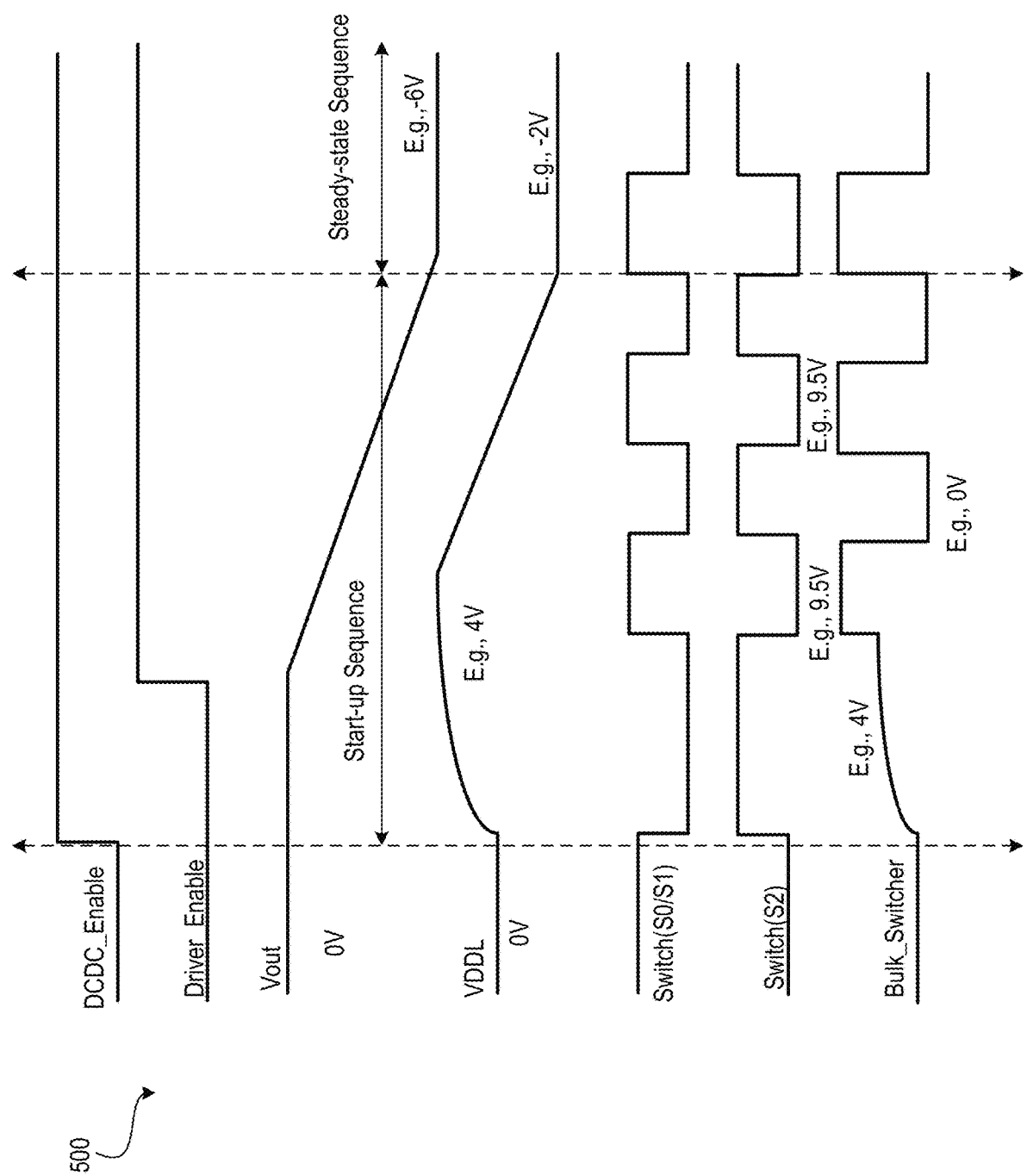
FIG. 5 illustrates a timing diagram of the bootstrap switch of FIG. 4 during startup and steady-state, in accordance with some embodiments.

FIG. 4 illustrates apparatus 400 with a bootstrap switch 302 with dynamic bulk biasing circuitry, in accordance with some embodiments. FIG. 5 illustrates timing diagram 500 of the bootstrap switch of FIG. 4 during startup and steady-state, in accordance with some embodiments.

Compared to apparatus 300, here apparatus 400 comprises dynamic biasing circuitry which includes p-type transistors MP0 and MP1, and switches S1 and S2. Switches can be implemented as one or more transistors. In some embodiments, control for switches S1 and S0 are the same. In some embodiments, control for switch S1 is an inverse of control from driver 301. Switch S1 is coupled to drain/source terminals of transistors MP0 and MP1, while Bulk_switcher node (same as bulk node or bulk terminal of transistor MPb) is coupled to both switches S1 and S2. Switch S2 is coupled to the Bulk_switcher node and VBoot supply rail. The source/drain terminal of transistor MP0 is coupled to ground (VSS) while the gate terminal of transistor MP0 is coupled to VDDL supply rail. The source/drain terminal of transistor MP1 is coupled to VDDL supply rail while the gate terminal of transistor MP1 is coupled to the ground supply rail VSS. The substrate terminal is coupled to ground.

The dynamic bulk biasing apparatus 400 ensures no parasitic diodes D1/D2 of the bootstrap switch (S0) is forward biased across a range of the operation (e.g., an entire range of operation). In one example, during startup, when Vout is at 0 V, VDDL will reside either at 4 V or the supply voltage (VDD_PWR) whichever is lower. At the charging phase on the Cboot capacitor, the switches (S0/S1) are turned on and switch (S2) is turned off as shown in timing diagram 500. The back-to-back connection between transistors MP0 and MP1 finds the maximum voltage between the VDDL and ground (0 V). This maximum voltage is passed to the Bulk_switcher net.

At start-up, VDDL is positive (assuming Vout is at 0 V), the maximum selector circuit (e.g., the pair of cross-coupled transistors MP0 and MP1) passes VDDL to the Bulk_switcher net to ensure the NWELL is connected to a positive voltage. Hence, parasitic diodes (e.g., bulk-substrate D1 and drain-bulk D2) are reverse biased under start-up conditions.

Similarly, at the steady-state condition, VDDL level is at negative voltage (e.g., when Vout is at −6 V) and the back-to-back connection between transistors MP0 and MP1 passes VSS to the bulk_switcher node to ensure parasitic diodes D1 and D2 (i.e., bulk-to-substrate and drain-to-bulk diode) are reverse biased as well under steady-state conditions. During the second phase, switch S2 is turned on and switches S1 and S0 are turned off. Voltage on LX node moves to VDD_PWR (e.g., 5.5 V) causing VBoot to go 9.5 V, in this example. Since the Bulk_switcher node is connected to VBoot, both diodes (D1/D2) are in reverse biased condition.

Figure 6:
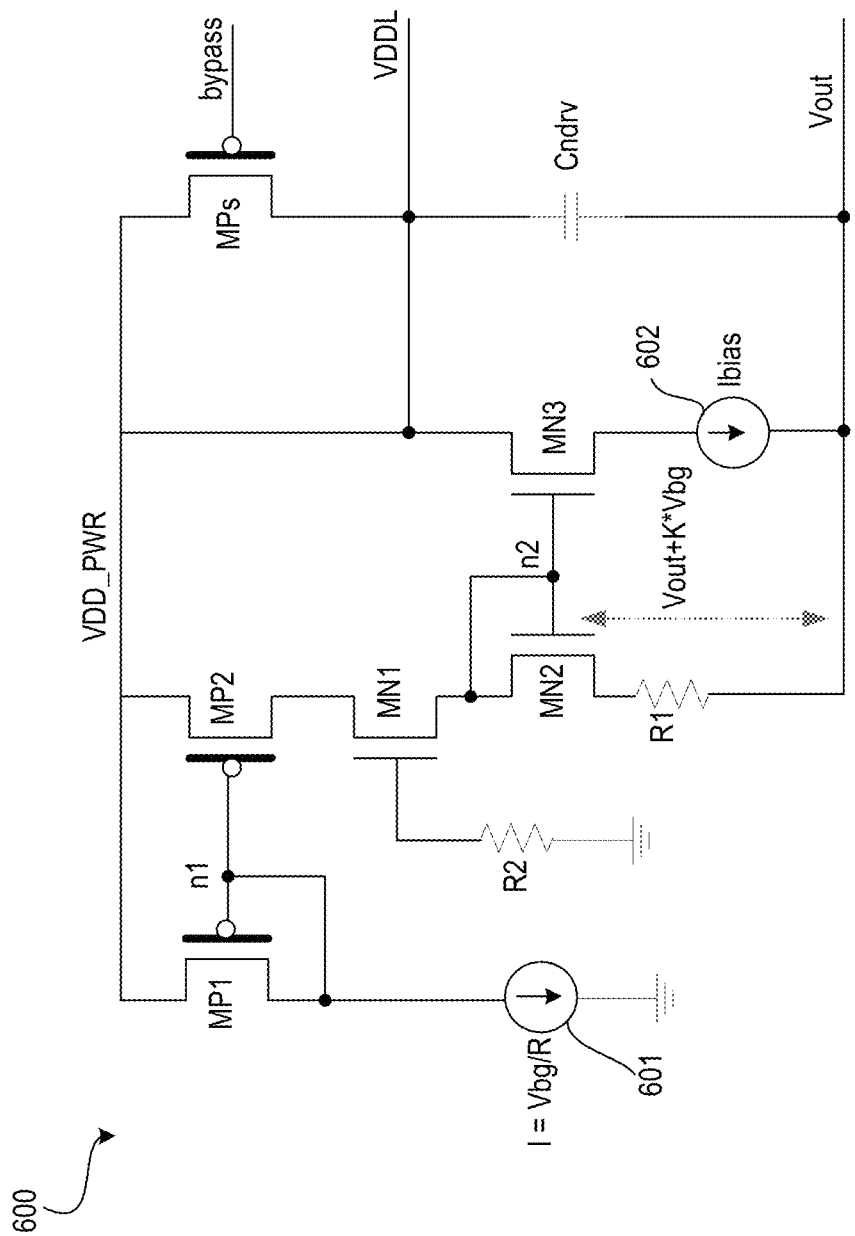
FIG. 6 illustrates an open loop supply generator for the bootstrap circuit, in accordance with some embodiments.

FIG. 6 illustrates open loop supply generator 600 (e.g., 201) for the bootstrap circuit 103, in accordance with some embodiments. Generator 600 comprises p-type transistors MP1, MP2, and MPs; n-type transistors MN1, MN2, and MN3, current sources 601 and 602, resistors or resistive devices R1 and R2, and capacitor Cndrv coupled as shown. Transistors MP1, MP2, and MPs are thick gate device or high-voltage (HV) devices. Transistors MN1, MN2, and MN3 are low-voltage (LV) devices or thin gate devices (or normal transistors). Resistors R1 and R2 can be discrete resistors or transistors operating in linear region. Current source 601 is a bandgap (bg) current source, where I=Vbg/R. Transistor MP1 is diode-connected and coupled to transistor MP2 via node n1, and forms a first current mirror. Transistor MN2 is diode-connected and coupled to transistor MN3 via node n2, and forms a second current mirror. Transistor MN1 is biased via R2.

The crude supply generator tracks the constant supply voltage with respect to Vout. In some embodiments, this is achieved through a V-to-I current (Vbg/R, untrimmed) which is passed across resistor R1 to keep voltage drop constant across PVT (process, voltage and temperature). The transistors MN2 and MN3 cancel threshold voltage variation across PVT. The bypass switch MPs is used during startup when Vout is zero and when Vin is low. In this case, VDDL output is not able to drive the low side driver hence bypass mode is used in this architecture.

$$VDDL = \left(Vout + \left(R1 * \frac{Vbg}{R}\right) + Vgs(MN2) - Vgs(MN3)\right) \quad (1)$$

Figure 7:
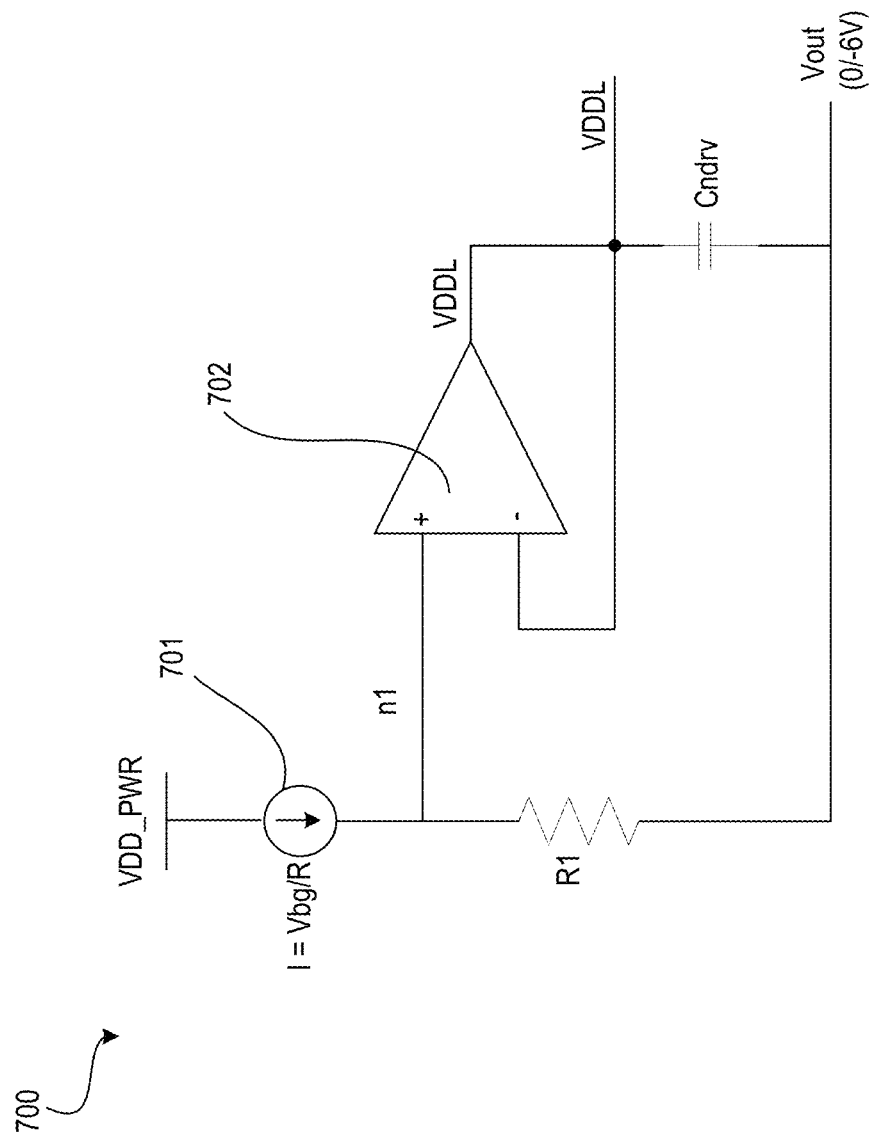
FIG. 7 illustrates a closed loop supply generator for the bootstrap circuit, in accordance with some embodiments.

FIG. 7 illustrates closed loop supply generator 700 (e.g., 201) for the bootstrap circuit, in accordance with some embodiments. Generator 700 comprises current source 701, amplifier 702, resistor R1, and capacitor CNdrv coupled as shown. Amplifier 702 is configured as a unity-gain amplifier where the output VDDL is coupled to a negative input terminal of amplifier 702, and node n1 is coupled to a positive input terminal of amplifier 702. Capacitor Cndrv between supply rails VDDL and Vout ensure that as Vout ramps down, VDDL ramps down too and follows Vout. The current source 701 is a bandgap current source, where I=Vbg/R. The output VDDL is expressed as:

$$VDDL = \left(Vout + \left(R1 * \frac{Vbg}{R}\right)\right) \quad (2)$$

Figure 8:
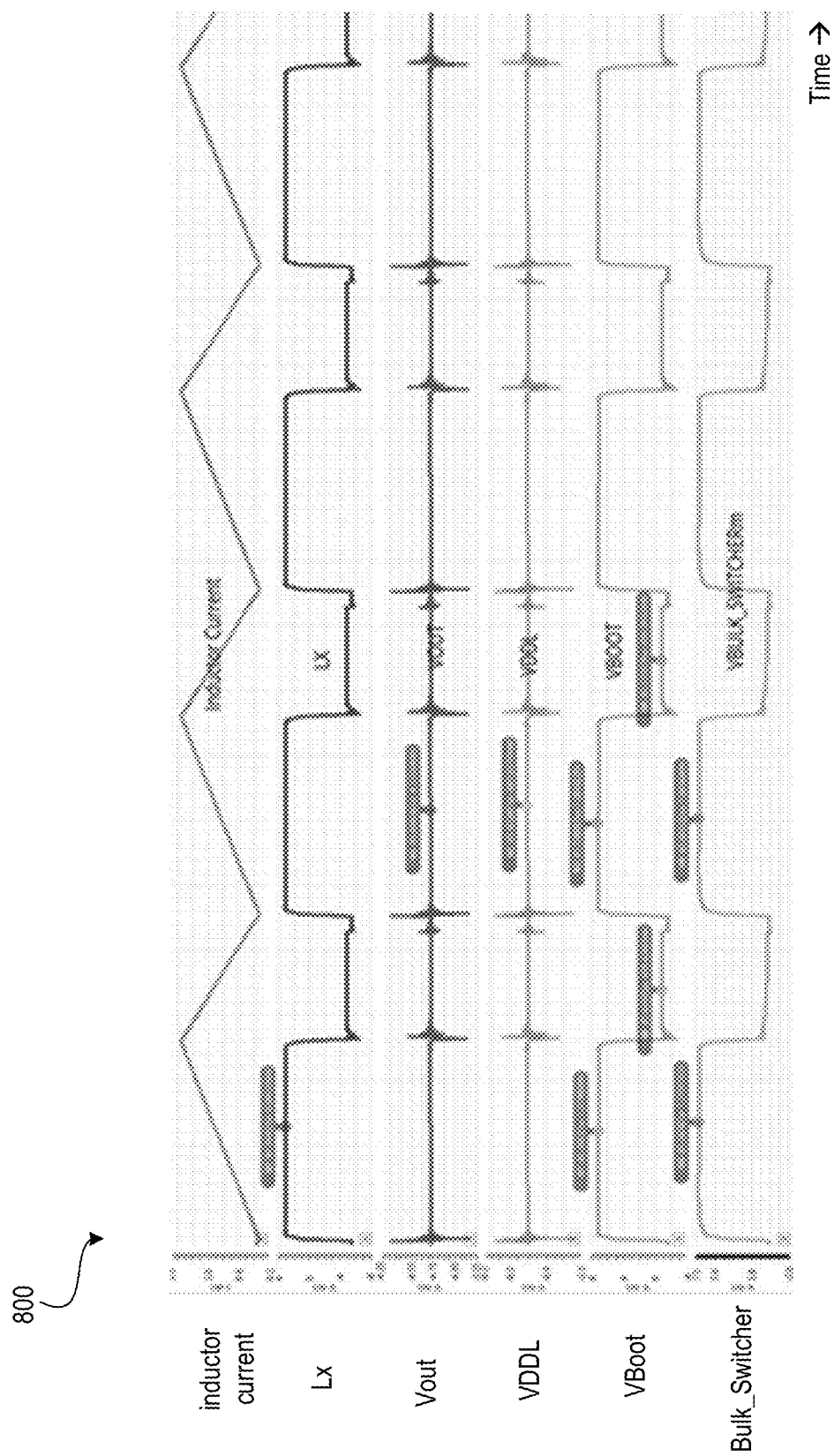
FIG. 8 illustrates a timing diagram of a simulation of the bootstrap circuit, in accordance with embodiments.

FIG. 8 illustrates timing diagram 800 of a simulation of the bootstrap circuit, in accordance with embodiments.

Figure 9:
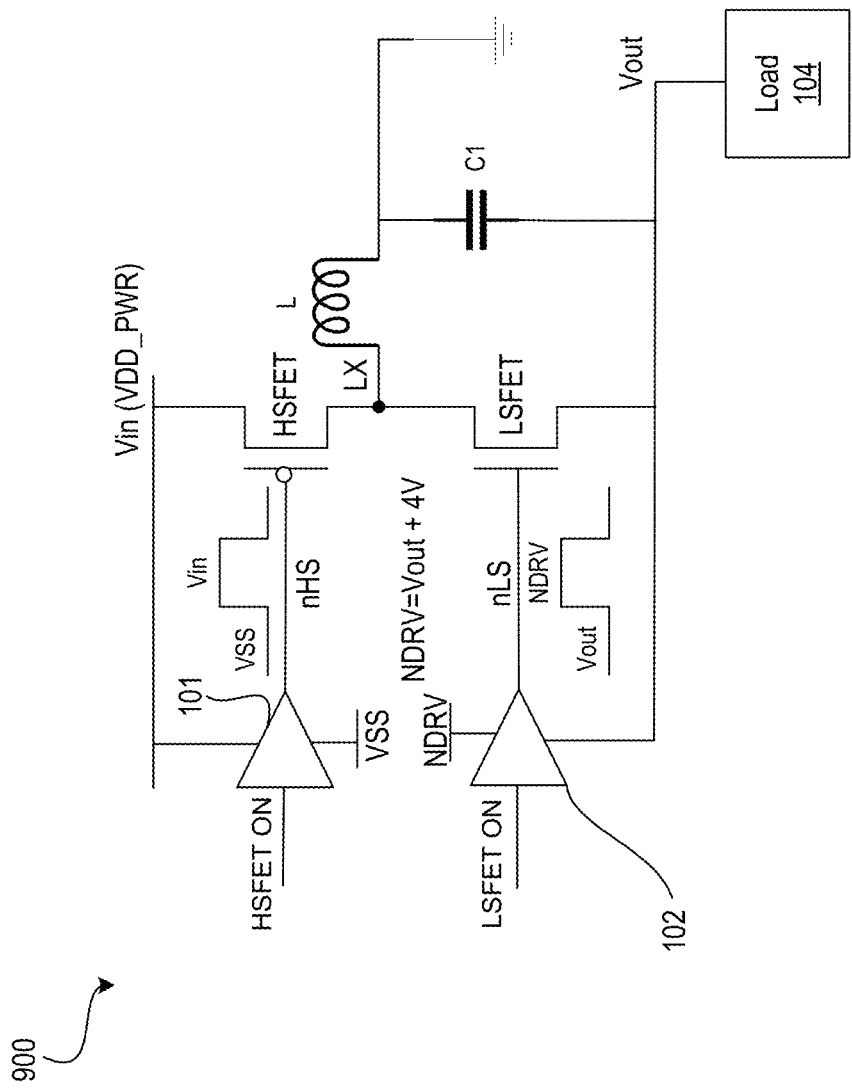
FIG. 9 illustrates an inverting DC-DC converter with p-type HSFET.

FIG. 9 illustrates an inverting DC-DC converter 900 with p-type HSFET. Compared to DC-DC converter 100, here HSFET is implemented as a p-type transistor instead of an n-type transistor. Driver 101 receives HSFET ON signal from a controller and outputs nHS to turn on/off the p-type HSFET. Signal nHS toggles between input power supply rail Vin (or VDD_PWR) and VSS (ground). Driver 102 receives LSFET ON signal from the controller and outputs nLS to turn on/off the n-type LSFET. Signal nLS toggles between power supply rail NDRV and Vout.

Inverting buck-boost DC-DC converter for 3D X Point Memory have input voltage range from 2 V to 5.5 V and an output range from −3 V to −6 V at steady state (0 V during start up). The maximum load the converter is expected to support is 600 mA, which causes a 3 A current through the HSFET. When the input voltage variation is high (e.g., 2 V to 5.5 V, at lower Vin of 2 V) the p-type HSFET switch becomes highly resistive and hence the size of the p-type HSFET becomes prohibitively high (e.g., around 2 times compared to nominal 3.3 V input) to support a full load. Such a large HSFET makes the product uncompetetive in terms of efficiency at nominal conditions. One solution is to use an n-type HSFET as described with reference to FIGS. 2-8. When an n-type HSFET is used, the voltage on LX and VBoot rails can swing in both positive and negative voltage domains. This makes the level-shifting of control signals from core domain to drivers 101/102 challenging. Core domain comprises controller and other circuitries that operate on a core power supply level, which is typically lower than VBoot and other supply levels. Also bootstrap circuit 103 or charge pump for the n-type HSFET architecture may use an external or internal (on-chip) capacitor Cboot with high capacitance (e.g., 100 nF external capacitor or 10 times the gate capacitance of HSFET if on-chip capacitor is used), which increases the bill-of-materials (BoM) and board cost.

Figure 10:
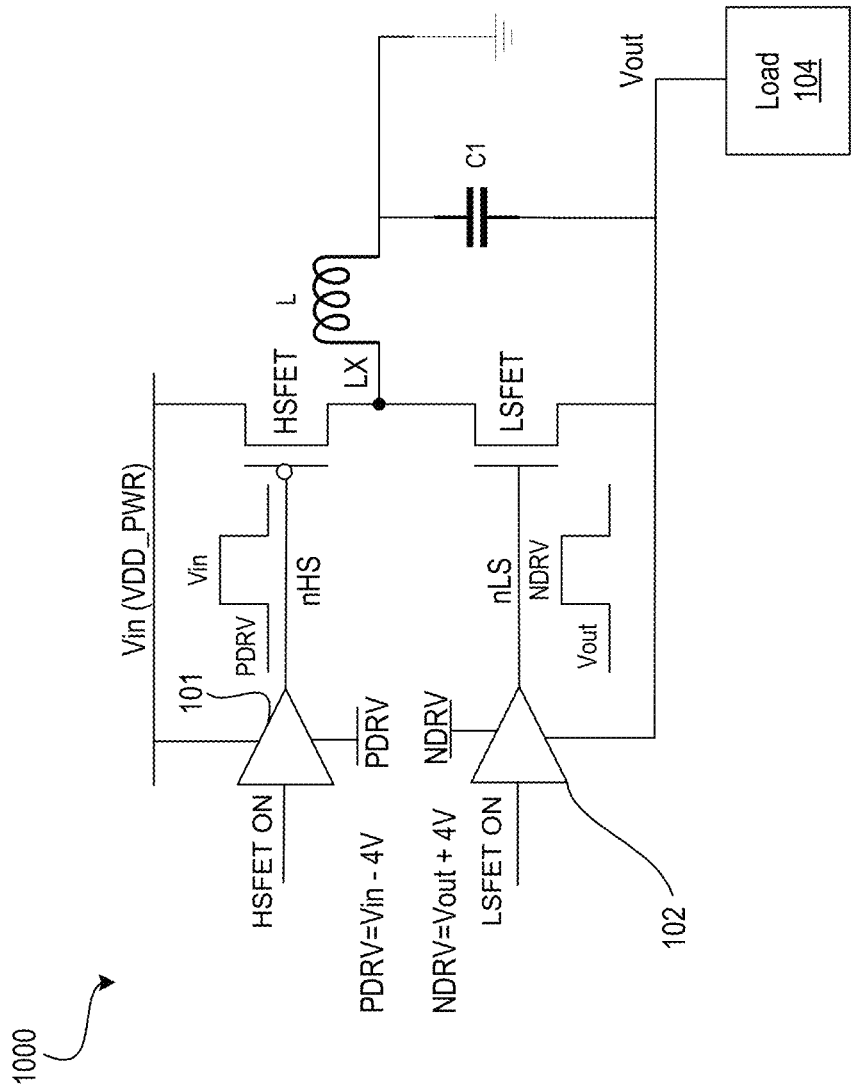
FIG. 10 illustrates an inverting DC-DC converter with substantially constant gate drive for the p-type HSFET, in accordance with some embodiments.

FIG. 10 illustrates inverting DC-DC converter 1000 with substantially constant gate drive for the p-type HSFET, in accordance with some embodiments. Some embodiments describe an architecture where PDRV supply is derived from input Vin and output Vout supply rails, and this PRDV supply maintains a constant differential voltage with respect to the input supply voltage Vin. The derived supply PDRV is used as the Low supply (LS) or 'ground' of HSFET Driver 101. As such, the p-type HSFET resistance becomes independent of supply variation. In one example, PDRV is set 4 V below Vin and this helps the p-type HSFET to get a constant drive, irrespective of variation in Vin. In other examples, other offset voltages may be used.

Figure 11:
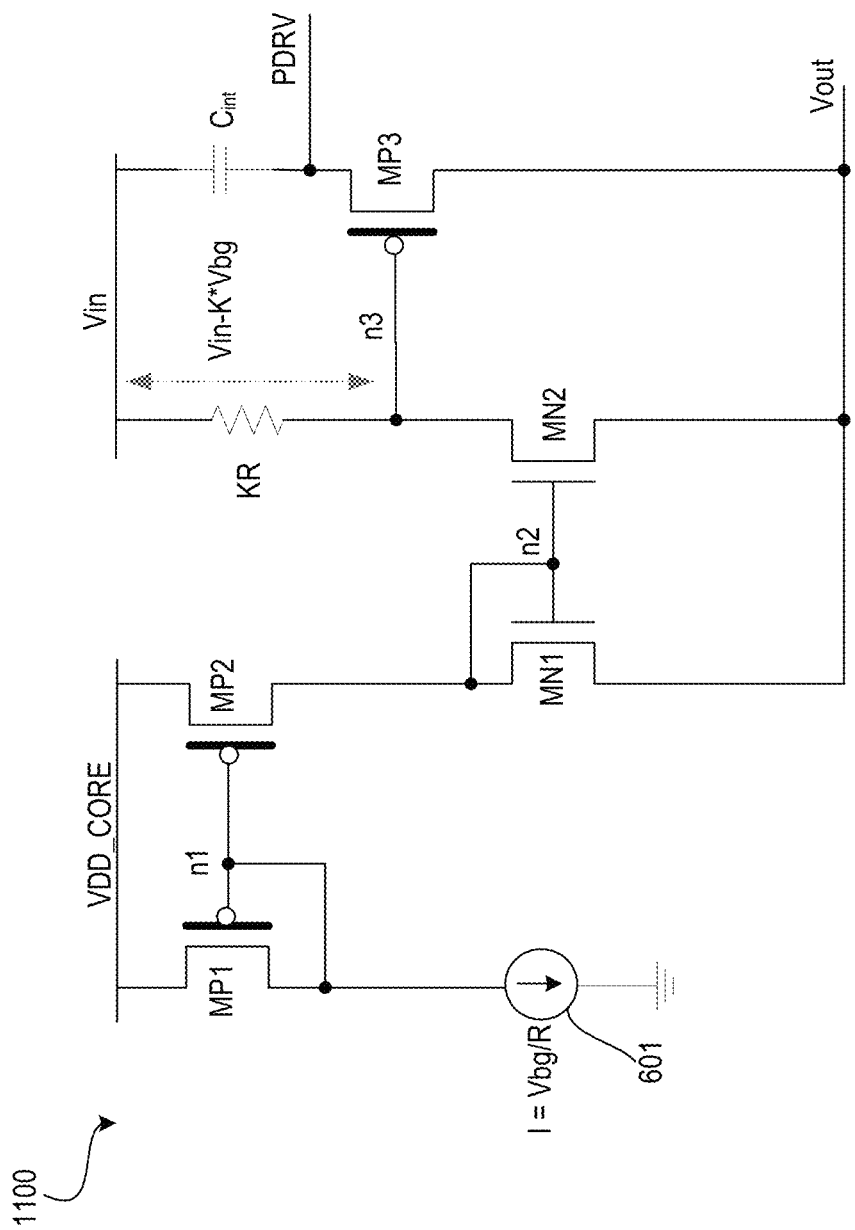
FIG. 11 illustrates an open loop supply generator to generate a supply for the driver of the p-type HSFET, in accordance with some embodiments.

FIG. 11 illustrates open loop supply generator 1100 to generate PRDV supply for the driver of the p-type HSFET, in accordance with some embodiments. Generator 1100 comprises current source 601, p-type transistors MP1, MP2 and MP3, n-type transistors MN1 and MN2, resistor KR, and capacitor CM coupled as shown. Transistors MP1 and MP2 are coupled to supply rail VDD_CORE (core supply rail). Transistor MP1 is diode-connected and coupled to transistor MP2 via node n1. The current I of current source 601 may be derived from a bandgap (bg) source, where I=Vbg/R. This current is mirrored onto transistor MP2. Current through MP2 is then mirrored by current mirror comprising diode-connected MN1 and MN2 via node n2. Transistors MN1 and M2 are coupled to output supply rail Vout. Resistor kR biases the driving transistor MP3. Transistor MP3 is coupled to output supply Vout and capacitor Cint, which in turn is coupled to input supply rail Vin. The source/drain terminal of transistor MP3 provides PRDV supply. In this architecture, transistors MP1, MP2, and MP3 are thick gate or high-voltage (HV) transistors, while transistors MN1 and MN2 are normal low-voltage (LV) n-type transistors or thin gate transistors.

A constant current is drawn from a resistor "kR" on Vin to generate a local supply that is I*kR times below the Vin supply. If the current 'I' is generated using a bandgap voltage Vbg, then 'I' is proportional to Vbg/R and I*kR becomes k*Vbg (Vgs voltage) which is a fixed drop from Vin. This voltage is used with one threshold Vt drop. Here, k is a scaling factor which can be adjusted by a designer according to the overdrive requirement of the field effect transistor (FET).

Figure 12:
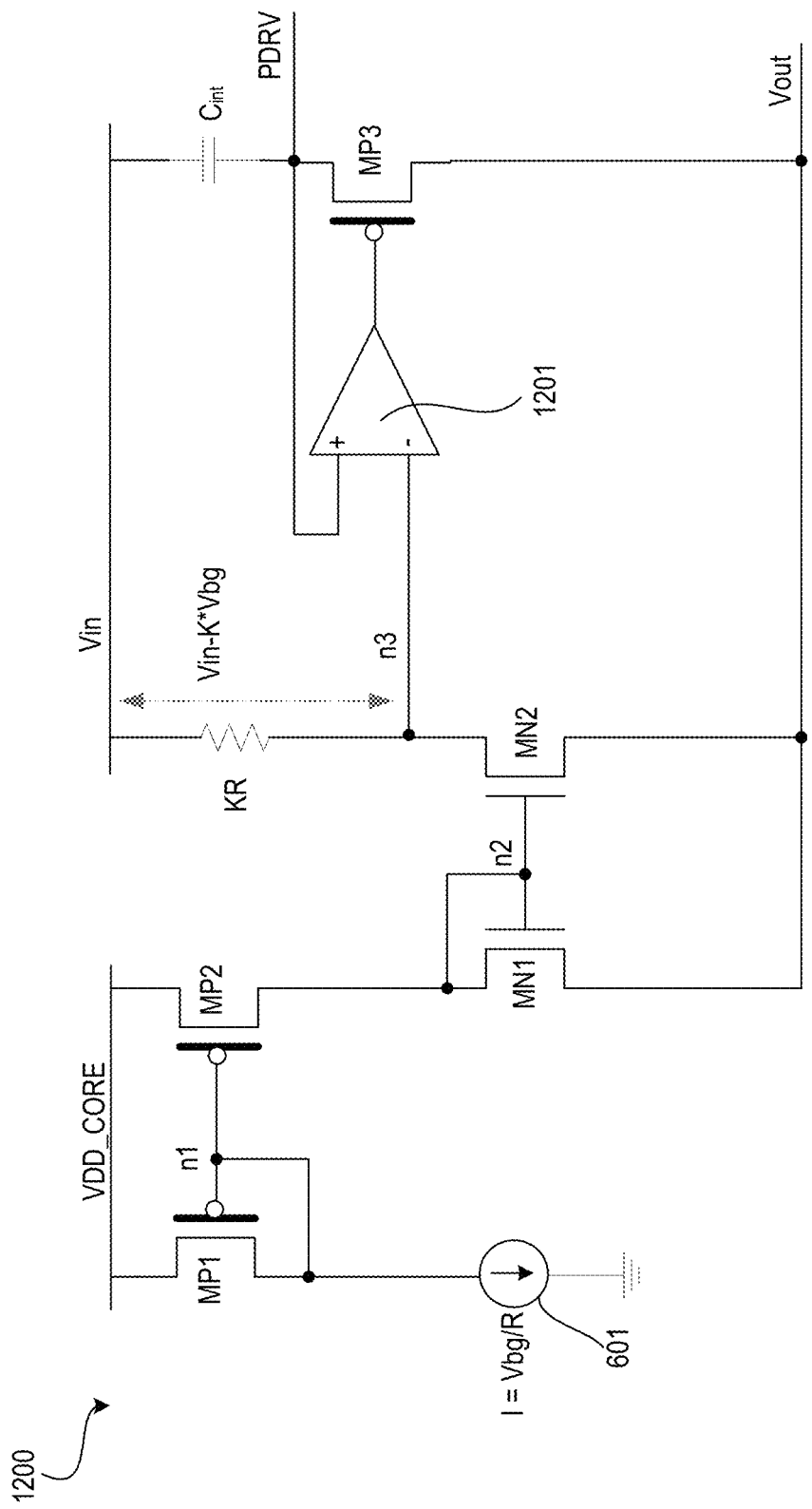
FIG. 12 illustrates a closed loop supply generator to generate a supply for the driver of the p-type HSFET, in accordance with some embodiments.

FIG. 12 illustrates closed loop supply generator 1200 to generate a supply for the driver of the p-type HSFET, in accordance with some embodiments. Compared to generator 1100 here, node n3 is coupled to amplifier 1201, which drives the gate of transistor MP3. Node n3 is coupled to a negative terminal of amplifier 1201 while PDRV rail is coupled to the positive terminal of amplifier 1201. Amplifier 1201 biases MP3 such that the voltage on PDRV is substantially the same as voltage on node n3. A constant current is drawn from a resistor 'kR' on Vin to generate a local supply that is I*kR times below the Vin supply. If the current 'I' is generated using a bandgap voltage Vbg, then 'I' is proportional to Vbg/R and I*kR becomes k*Vbg which is a fixed drop from Vin. This voltage is buffered by amplifier 1201 to bias transistor MP3.

Figure 13:
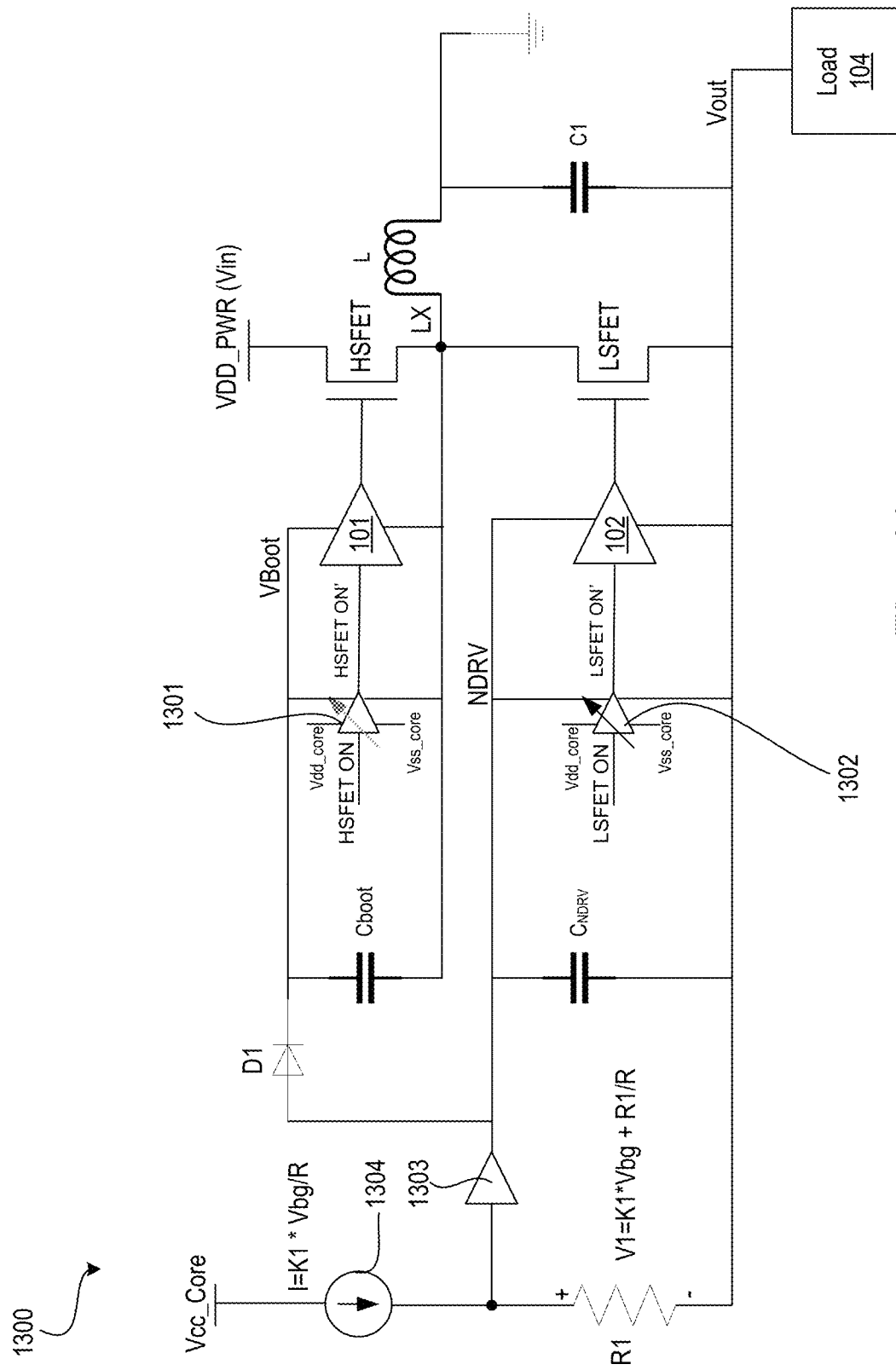
FIG. 13 illustrates a portion of an inverting DC-DC converter with a bootstrap circuit and various voltage domains.

FIG. 13 illustrates a portion of an inverting DC-DC converter 1300 with a bootstrap circuit and various voltage domains. Converter 1300 is similar to converter 100 but for the indication of level-shifters 1301 and 1302, and a variation of the bootstrap circuit 103. Converter 1300 comprises level-shifters 1301 and 1302 to drive HSFET driver 101 and LSFET driver 102, respectively; n-type HSFET (n-type high-side switch), n-type LSFET (n-type low-side switch), load capacitor C1, bootstrap capacitor Cboot, diode D1, buffer 1303, current source 1304, resistor R1, and capacitor CNDRV coupled as shown. To support an n-type HSFET, bootstrap circuit is typically used which maintains enough $V_{GS}$ for the n-type HSFET when switch node LX, goes to Vin (e.g., battery voltage, VDD_PWR). With the bootstrap circuit in place, the control signals for HSFET driver 101 are level-shifted to a floating domain, between Vboot and Vlx (voltage on LX). For an inverting buck-boost DC-DC converter, the floating domain introduces a wide range of input output voltages making the level-shifting scheme complex.

For example, for Vin approximately 1.9 V to 5.5 V, Vout is apprximately –3 V to –6 V, with gate drive (Voltage of Bootstrap capacitor Cboot) maintained at 4 V, level-shifting needs to take care of following cases. In the first case, the level-shifter is to handle maximum voltage Vlx swing on LX node of –6 V to 5.5 V, and for VBoot –2 V to 9.5 V. In the second case, the level-shifter is to handle a minimum voltage Vlx swing on LX node of –2 V to 1.9 V and for Vboot 2 V to 5.9 V. In the third case, the level-shifter is expected to support Vlx swings of 0 V to 1.9 V and for Vboot 0 V to 3.8 V for startup. One way to support high-voltage without reliability concerns is to either use cascode devices or clamps. Cascode devices cannot support low supply voltages because of headroom issues. Clamps, on the other hand, constantly leak making them high power level-shifters.

Figure 14:
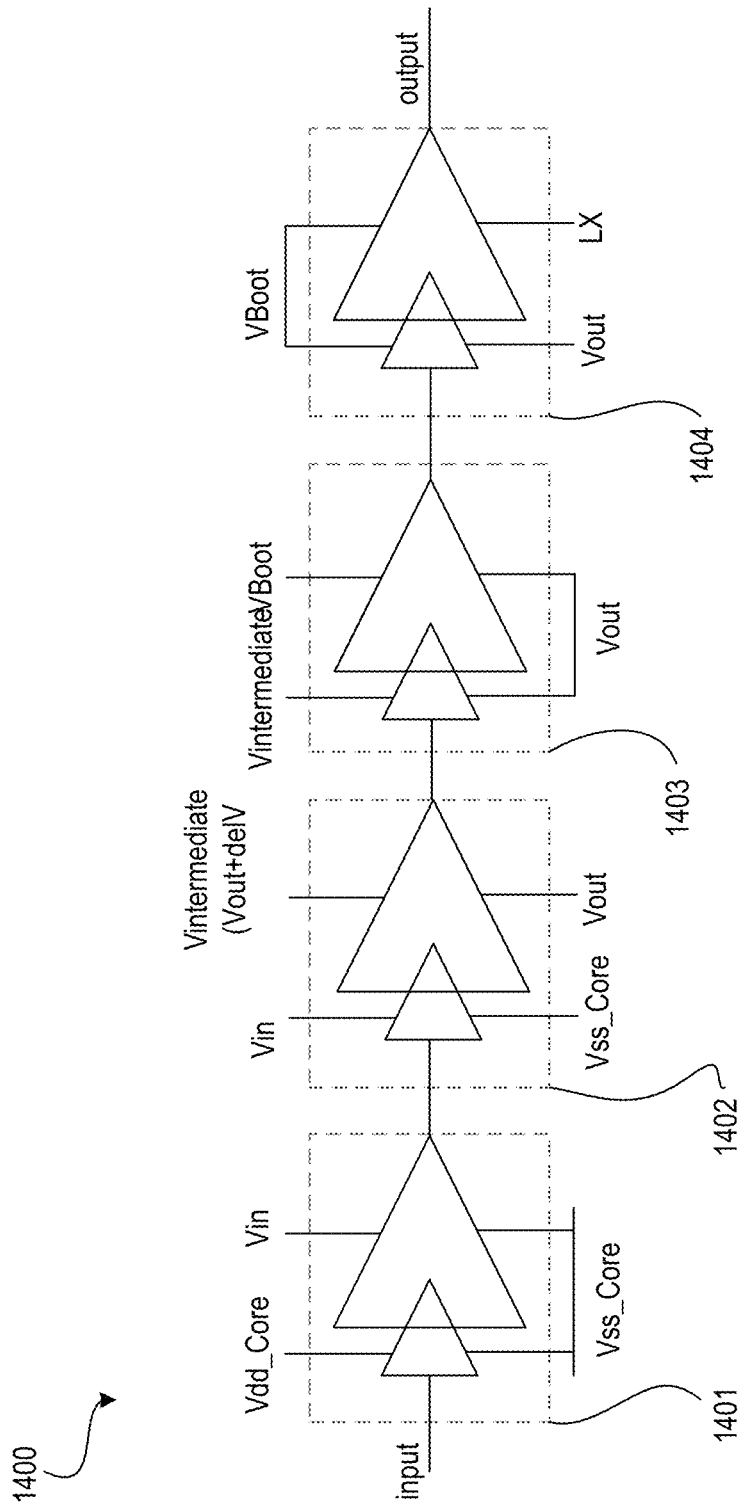
FIG. 14 illustrates a level-shifting scheme for driving the n-type HSFET, in accordance with some embodiments.

FIG. 14 illustrates level-shifting scheme 1400 for driving the n-type HSFET, in accordance with some embodiments. Level-shifting scheme 1400 illustrates four level-shifting operations by level-shifters 1401, 1402, 1403, and 1404. The circuitry that gernates the input in on Vdd_Core domain. As such, the input swings between Vdd_Core and Vss_Core voltage levels. The input is first level-shifted to Vin domain by level-shifter 1401. Any suitable level-shifter can be used for implementing level-shifter 1401. For example, a level-shifter with cross-coupled devices can be used for level-shifter 1401. The output of level-shifter 1401 in the Vin domain is level-shifted to a different swing by level-shifter 1402. In this case, the output of level-shifter 1402 swings between Vin and Vout. Level-shifter 1402 level-shifts a signal that swings between NDRV and Vout to VBoot and Vout. Level-shifter 1404 level-shifts a signal that swings between VBoot and Vout to VBoot and LX (or Vlx).

In one example, buck-boost DC-DC converter 200 supports a wide range of input and output voltages. Table 2 summarizes the range of voltages for a 3D X-point memory as load.

| Signal | Minimum | Maximum |
|---|---|---|
| Vin | 1.9 volt | 5.5 volt |
| Vout | 0 volt (Startup)/–3 volt (Steady State) | –6 volt |
| Vin – Vout | 1.9 volt | 11 volt |
| Vboot – Vout | 1.9 volt | 16 volt |

Since both Vlx and Vboot can have positive as well as negative voltages, level-shifting scheme is not referenced with respect to ground but is referenced with respect to Vout. Also, negative output voltage demands an internal tracking supply (NDRV) with respect to Vout as driver supply is to turn off/on LSFET reliably (without hitting the reliability limit).

The level-shifting scheme 1400 uses an intermediate stage between Vout (e.g., always negative or 0) and NDRV (e.g., approximately Vout+4V) to take care of negative values of Vlx/Vboot as Vboot is higher than Vout. Core domain control signals for power train are first level-shifted to battery voltage 'Yin' (shifting to core domain may not be possible because of higher threshold voltage of HV devices) and subsequently to intermediate stage of NDRV and Vout and finally to floating stage of Vlx/Vboot.

One challenge is to design the stage between Vboot and Vout since the differential voltage can vary from, for example, 1.9 V to 15.5 V. The use of cascode protection may crunch the bottom devices along with contribution in duty-cycle distortion. The use of clamps for device protection comes at the cost of Quiescent current (IQ).

Figure 15:
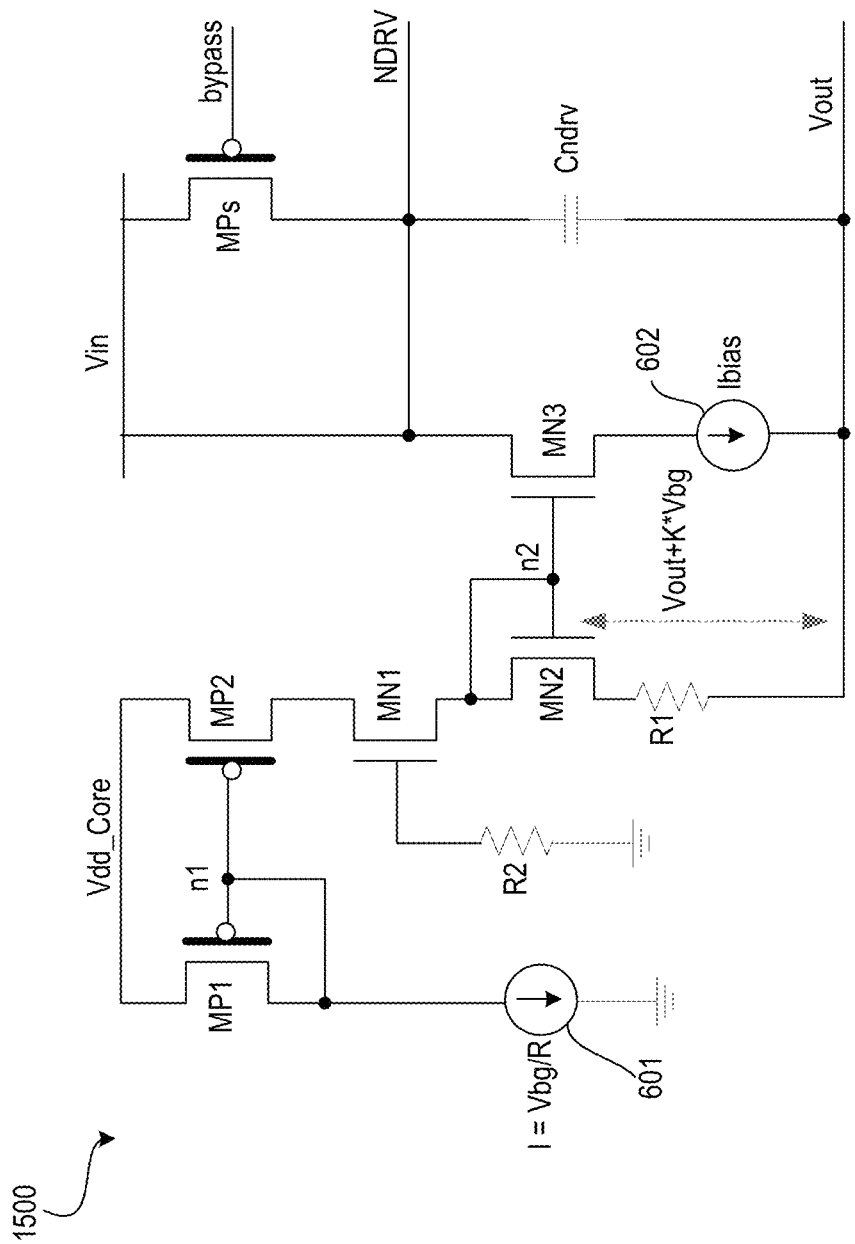
FIG. 15 illustrates a supply generator to generate one of the supplies for the level-shifting scheme for driving the n-type HSFET, in accordance with some embodiments.

FIG. 15 illustrates supply generator 1500 to generate one of the supplies for the level-shifting scheme for driving the n-type HSFET, in accordance with some embodiments. Generator 1500 comprises p-type transistors MP1, MP2, MPs; n-type transistors MN1, MN2, and MN3, current sources 601 and 602, resistors or resistive devices R1 and R2, and capacitor Cndry coupled as shown. Transistors MP1, MP2, and MPs are thick gate devices or high-voltage (HV) devices. Transistors MN1, MN2, and MN3 are low-voltage (LV) devices or thin gate devices (or normal transistors). Resistors R1 and R2 can be discrete resistors or transistors operating in linear region. Current source 601 is a bandgap current source, where I=Vbg/R. Transistor MP1 is diode-connected and coupled to transistor MP2 via node n1, and forms a first current mirror. Transistor MN2 is diode-connected and coupled to transistor MN3 via node n2, and forms a second current mirror. Transistor MN1 is biased via R2. Here, part of the circuit is on core voltage domain Vdd_Core while the other part is on input voltage domain Vin. Transistors MP1 and MP2 are coupled to Vdd_Core supply rail while transistors MN3 and MPs are coupled to input supply rail Vin.

The crude supply generator tracks the constant supply voltage with respect to Vout. In some embodiments, this is achieved through a V-to-I current (Vbg/R, untrimmed) which is passed across resistor R1 to keep voltage drop constant across PVT (process, voltage and temperature). The transistors MN2 and MN3 cancel threshold voltage variation across PVT. The bypass switch MPs is used during startup when Vout is zero and when Vin is low. In this case, NVDRV output is not able to drive the low side driver hence bypass mode is used in this architecture.

$$NDRV = \left(V\text{out} + \left(R1 * \frac{Vbg}{R}\right) + Vgs(MN2) - Vgs(MN3)\right) \quad (3)$$

Figure 16:
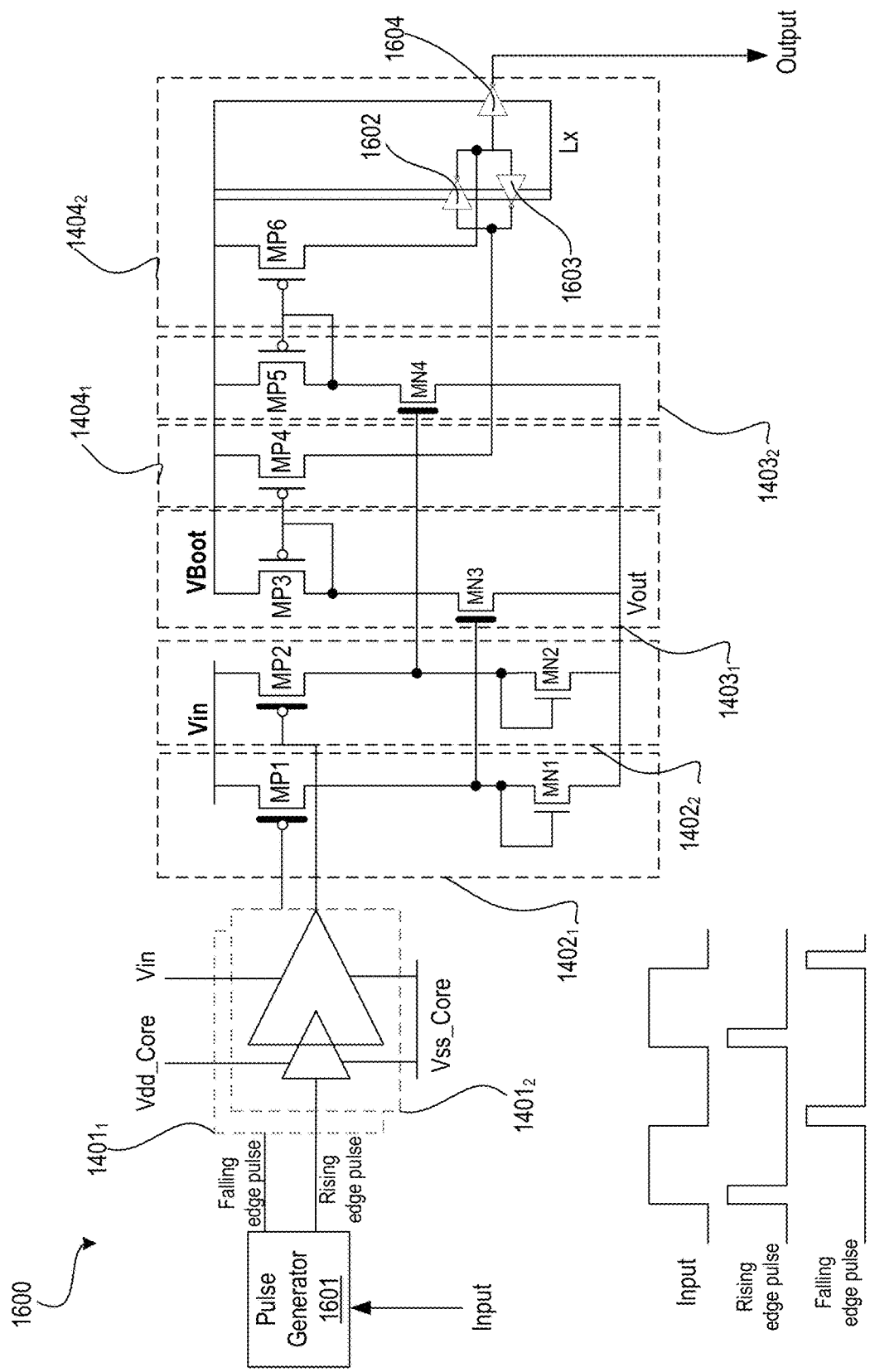
FIG. 16 illustrates a circuit schematic of the level-shifter for the inverting DC-DC converter, in accordance with some embodiments.

FIG. 16 illustrates circuit schematic of level-shifter 1600 for the inverting DC-DC converter, in accordance with some embodiments. The schematic of FIG. 16 illustrates an implementation of the level-shifter scheme 1400. Level-shifter 1600 comprises a pulse generator 1601, a first level-shifter stage $1401_{1-2}$, a second level-shifter stage $1402_{1-2}$, a third level-shifter stage $1403_{1-2}$, and a fourth level-shifter stage $1404_{1-2}$. The input is received by pulse generator 1601 which generates a falling edge pulse and rising edge pulse from the input. First level-shifter stage $1401_{1-2}$ receives the falling edge pulse and rising edge pulse in the Vdd_Core domain, respectively, and generates outputs in the Vin voltage domain. Any suitable level-shifter can be used to implement the two parallel level-shifters of first level-shifter stage $1401_{1-2}$.

The falling edge pulse in Vin voltage domain is level-shifted by second stage $1402_1$ to Vout domain with a signal swing between Vin and Vout. Stage $1402_1$ comprises p-type transistor MP1 coupled in series with diode-connected MN1 transistor. P-type transistor MP1 is a thick gate or high-voltage transistor, which receives the output of first level-shifter stage $1401_1$. The source of transistor MP1 is coupled to Vin power supply rail. The source of MN1 is coupled to Vout supply rail. The drain of transistor MN1 is provided as input to n-type transistor MN3 of third stage $1403_1$. The source terminal of MN3 is coupled Vout supply rail. Third stage $1403_1$ also comprises p-type transistor MP3 coupled in series with MN3. The source terminal of MP3 is coupled to VBoot supply rail.

The rising edge pulse in Vin voltage domain is level-shifted by second stage $1402_2$ to Vout domain with a signal swing between Vin and Vout. Stage $1402_2$ comprises p-type transistor MP2 coupled in series with diode-connected MN2 transistor. P-type transistor MP2 is a thick gate or high-voltage transistor, which receives the output of first level-shifter stage $1401_2$. The source of transistor MP2 is coupled to Vin power supply rail. The source of MN2 is coupled to Vout supply rail. The drain on transistor MN2 is provided as input to n-type transistor MN4 of third stage $1403_2$. Third stage $1403_2$ also comprises p-type transistor MP4 coupled in series with MN4. Transistors MP3 and MP4 form a current mirror together, wherein transistor MP3 is diode-connected. The source terminal of transistor MP4 is coupled to VBoot supply rail. Transistor MP4 is part of the fourth stage $1404_1$.

The drain terminal of MP4 is coupled to memory element comprising back-to-back coupled inverters 1601 and 1602. The p-type transistor of the inverters 1601 and 1602 is coupled to VBoot supply rail. The low supply rail is coupled to n-type transistor of inverters 1601 and 1602. The low supply rail is LX. The output of the memory element is coupled to output inverter 1604. The p-type transistor of the output inverter 1604 is coupled to supply rail VBoot. The low supply rail (LX) is coupled to the n-type transistor of inverter 1604.

Transistor MN4 is coupled in series with p-type transistor MP5 of the third stage $1403_2$. The source terminal of MP5 is coupled to VBoot supply rail. Transistor MP5 and transistor MP6 together form a current mirror, where transistor MP5 is diode-connected. Transistor MP6 is part of the fourth stage $1404_2$. The drain terminal of transistor MP6 is coupled to the memory element. The falling and rising edge pulses behave as set and reset pulses for the memory element. As such, the memory element behaves as a set-reset (SR) latch, in accordance with various embodiments. The set and reset pulses set and reset the floating nodes of the memory element. These floating nodes are outputs of inverters 1602 and 1603. Current pulses are used to change the state of the SR latch, which are generated from the input signal edge transitions. This ensures that there is no quiescent current (or substantially zero quiescent current) along with low average current. Transistors MP1, MP2, MN3 and MN4 are high-voltage LDMOS (laterally-diffused metal-oxide semiconductor) transistors with higher Vds breakdown limits compared to regular MOSFETs. The remaining transistors are low voltage transistors (which include a mix of thin and thick gate oxide devices). In various embodiments, transistor MP4 is larger than the p-type device of the inverters 1602 and 1603.

Figure 17:
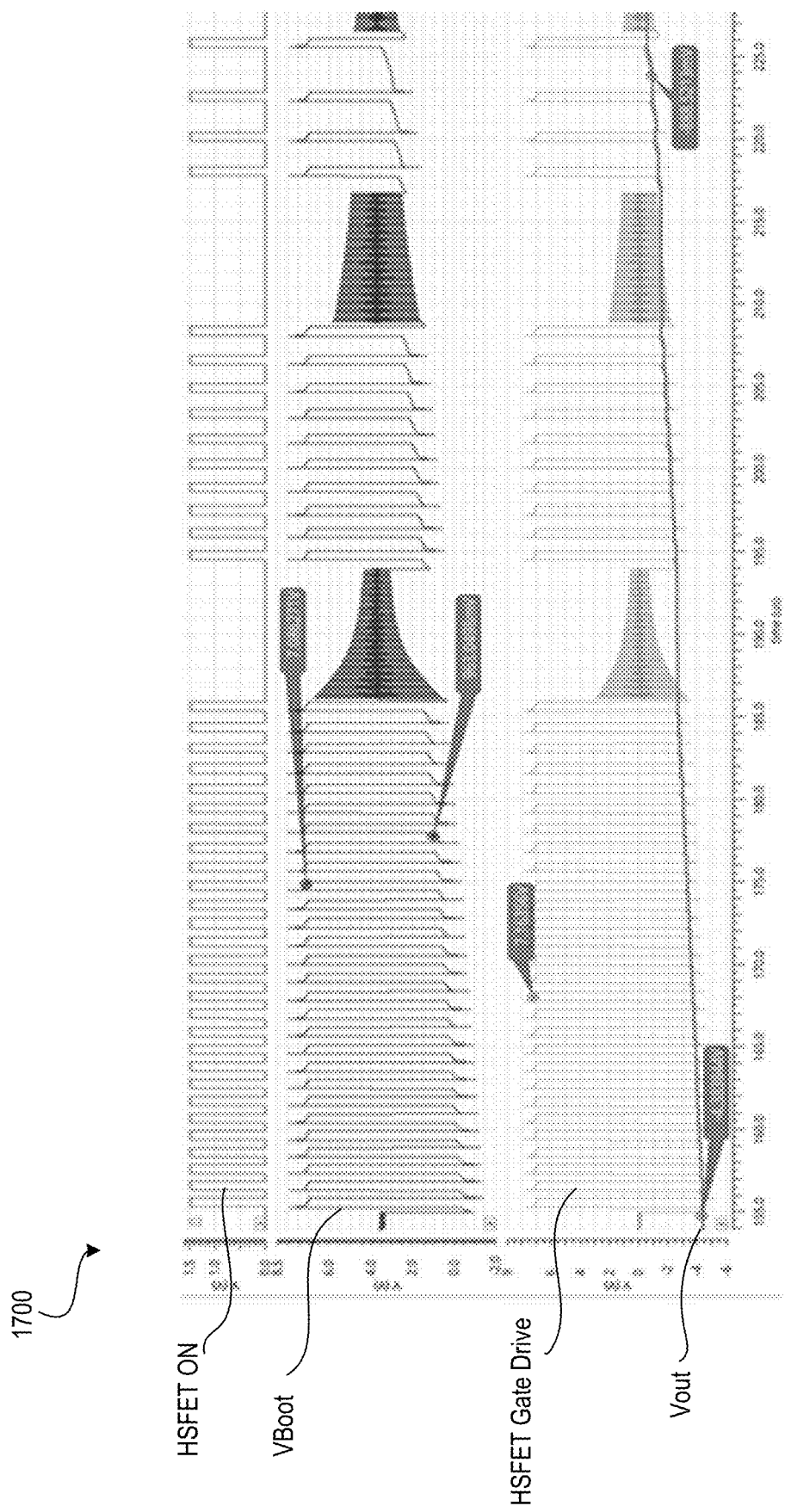
FIG. 17 illustrates a plot showing operation of the level-shifter for the inverting DC-DC converter, in accordance with some embodiments.

FIG. 17 illustrates plot 1700 showing operation of the level-shifter for the inverting DC-DC converter, in accordance with some embodiments.

Figure 18:
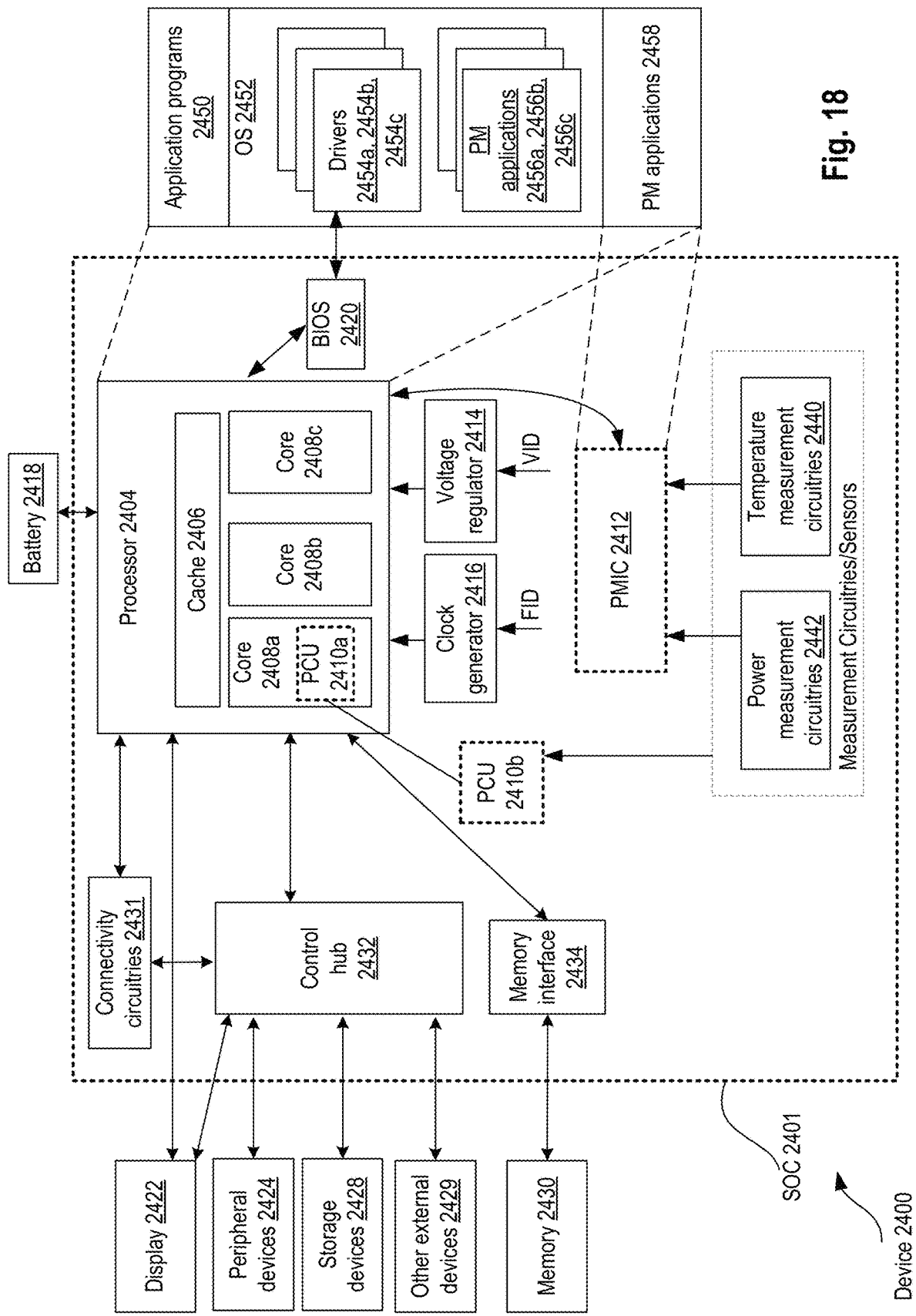
FIG. 18 illustrates a smart device or a computer system or an SoC (System-on-Chip) coupled to a power management integrated circuit (PMIC) which includes the inverting DC-DC converter of various embodiments, in accordance with various embodiments.

FIG. 18 illustrates a smart device or a computer system or an SoC (System-on-Chip) coupled to a power management integrated circuit (PMIC) 2412 which includes the inverting DC-DC converter of various embodiments, in accordance with various embodiments. It is pointed out that those elements of FIG. 18 having the same reference numbers (or names) as the elements of any other figure can operate or function in any manner similar to that described, but are not limited to such. In some embodiments, PMIC 2312 with the inverting DC-DC converter provides power to a high-density three dimensional (3D) X-point memory. The output supply range of the inverting DC-DC converter is 0 V to −6 V.

In some embodiments, device 2400 represents an appropriate computing device, such as a computing tablet, a mobile phone or smart-phone, a laptop, a desktop, an Internet-of-Things (IOT) device, a server, a wearable device, a set-top box, a wireless-enabled e-reader, or the like. It will be understood that certain components are shown generally, and not all components of such a device are shown in device 2400.

In an example, the device 2400 comprises a SoC (System-on-Chip) 2401. An example boundary of the SOC 2401 is illustrated using dotted lines in FIG. 18, with some example components being illustrated to be included within SOC 2401—however, SOC 2401 may include any appropriate components of device 2400.

In some embodiments, device 2400 includes processor 2404. Processor 2404 can include one or more physical devices, such as microprocessors, application processors, microcontrollers, programmable logic devices, processing cores, or other processing means. The processing operations performed by processor 2404 include the execution of an operating platform or operating system on which applications and/or device functions are executed. The processing operations include operations related to I/O (input/output) with a human user or with other devices, operations related to power management, operations related to connecting computing device 2400 to another device, and/or the like. The processing operations may also include operations related to audio I/O and/or display I/O.

In some embodiments, processor 2404 includes multiple processing cores (also referred to as cores) 2408a, 2408b, 2408c. Although merely three cores 2408a, 2408b, 2408c are illustrated in FIG. 18, processor 2404 may include any other appropriate number of processing cores, e.g., tens, or even hundreds of processing cores. Processor cores 2408*a*, 2408*b*, 2408*c* may be implemented on a single integrated circuit (IC) chip. Moreover, the chip may include one or more shared and/or private caches, buses or interconnections, graphics and/or memory controllers, or other components.

In some embodiments, processor 2404 includes cache 2406. In an example, sections of cache 2406 may be dedicated to individual cores 2408 (e.g., a first section of cache 2406 dedicated to core 2408*a*, a second section of cache 2406 dedicated to core 2408*b*, and so on). In an example, one or more sections of cache 2406 may be shared among two or more of cores 2408. Cache 2406 may be split in different levels, e.g., level 1 (L1) cache, level 2 (L2) cache, level 3 (L3) cache, etc.

In some embodiments, processor core 2404 may include a fetch unit to fetch instructions (including instructions with conditional branches) for execution by the core 2404. The instructions may be fetched from any storage devices such as the memory 2430. Processor core 2404 may also include a decode unit to decode the fetched instruction. For example, the decode unit may decode the fetched instruction into a plurality of micro-operations. Processor core 2404 may include a schedule unit to perform various operations associated with storing decoded instructions. For example, the schedule unit may hold data from the decode unit until the instructions are ready for dispatch, e.g., until all source values of a decoded instruction become available. In one embodiment, the schedule unit may schedule and/or issue (or dispatch) decoded instructions to an execution unit for execution.

The execution unit may execute the dispatched instructions after they are decoded (e.g., by the decode unit) and dispatched (e.g., by the schedule unit). In an embodiment, the execution unit may include more than one execution unit (such as an imaging computational unit, a graphics computational unit, a general-purpose computational unit, etc.). The execution unit may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit.

Further, execution unit may execute instructions out-of-order. Hence, processor core 2404 may be an out-of-order processor core in one embodiment. Processor core 2404 may also include a retirement unit. The retirement unit may retire executed instructions after they are committed. In an embodiment, retirement of the executed instructions may result in processor state being committed from the execution of the instructions, physical registers used by the instructions being de-allocated, etc. Processor core 2404 may also include a bus unit to enable communication between components of processor core 2404 and other components via one or more buses. Processor core 2404 may also include one or more registers to store data accessed by various components of the core 2404 (such as values related to assigned app priorities and/or sub-system states (modes) association.

In some embodiments, device 2400 comprises connectivity circuitries 2431. For example, connectivity circuitries 2431 includes hardware devices (e.g., wireless and/or wired connectors and communication hardware) and/or software components (e.g., drivers, protocol stacks), e.g., to enable device 2400 to communicate with external devices. Device 2400 may be separate from the external devices, such as other computing devices, wireless access points or base stations, etc.

In an example, connectivity circuitries 2431 may include multiple different types of connectivity. To generalize, the connectivity circuitries 2431 may include cellular connectivity circuitries, wireless connectivity circuitries, etc. Cellular connectivity circuitries of connectivity circuitries 2431 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. Wireless connectivity circuitries (or wireless interface) of the connectivity circuitries 2431 refers to wireless connectivity that is not cellular, and can include personal area networks (such as Bluetooth, Near Field, etc.), local area networks (such as Wi-Fi), and/or wide area networks (such as WiMax), and/or other wireless communication. In an example, connectivity circuitries 2431 may include a network interface, such as a wired or wireless interface, e.g., so that a system embodiment may be incorporated into a wireless device, for example, a cell phone or personal digital assistant.

In some embodiments, device 2400 comprises control hub 2432, which represents hardware devices and/or software components related to interaction with one or more I/O devices. For example, processor 2404 may communicate with one or more of display 2422, one or more peripheral devices 2424, storage devices 2428, one or more other external devices 2429, etc., via control hub 2432. Control hub 2432 may be a chipset, a Platform Control Hub (PCH), and/or the like.

For example, control hub 2432 illustrates one or more connection points for additional devices that connect to device 2400, e.g., through which a user might interact with the system. For example, devices (e.g., devices 2429) that can be attached to device 2400 include microphone devices, speaker or stereo systems, audio devices, video systems or other display devices, keyboard or keypad devices, or other I/O devices for use with specific applications such as card readers or other devices.

As mentioned above, control hub 2432 can interact with audio devices, display 2422, etc. For example, input through a microphone or other audio device can provide input or commands for one or more applications or functions of device 2400. Additionally, audio output can be provided instead of, or in addition to display output. In another example, if display 2422 includes a touch screen, display 2422 also acts as an input device, which can be at least partially managed by control hub 2432. There can also be additional buttons or switches on computing device 2400 to provide I/O functions managed by control hub 2432. In one embodiment, control hub 2432 manages devices such as accelerometers, cameras, light sensors or other environmental sensors, or other hardware that can be included in device 2400. The input can be part of direct user interaction, as well as providing environmental input to the system to influence its operations (such as filtering for noise, adjusting displays for brightness detection, applying a flash for a camera, or other features).

In some embodiments, control hub 2432 may couple to various devices using any appropriate communication protocol, e.g., PCIe (Peripheral Component Interconnect Express), USB (Universal Serial Bus), Thunderbolt, High Definition Multimedia Interface (HDMI), Firewire, etc.

In some embodiments, display 2422 represents hardware (e.g., display devices) and software (e.g., drivers) components that provide a visual and/or tactile display for a user to interact with device 2400. Display 2422 may include a display interface, a display screen, and/or hardware device used to provide a display to a user. In some embodiments, display 2422 includes a touch screen (or touch pad) device that provides both output and input to a user. In an example, display 2422 may communicate directly with the processor 2404. Display 2422 can be one or more of an internal display device, as in a mobile electronic device or a laptop device or an external display device attached via a display interface (e.g., DisplayPort, etc.). In one embodiment display 2422 can be a head mounted display (HMD) such as a stereoscopic display device for use in virtual reality (VR) applications or augmented reality (AR) applications.

In some embodiments, and although not illustrated in the figure, in addition to (or instead of) processor 2404, device 2400 may include Graphics Processing Unit (GPU) comprising one or more graphics processing cores, which may control one or more aspects of displaying contents on display 2422.

Control hub 2432 (or platform controller hub) may include hardware interfaces and connectors, as well as software components (e.g., drivers, protocol stacks) to make peripheral connections, e.g., to peripheral devices 2424.

It will be understood that device 2400 could both be a peripheral device to other computing devices, as well as have peripheral devices connected to it. Device 2400 may have a "docking" connector to connect to other computing devices for purposes such as managing (e.g., downloading and/or uploading, changing, synchronizing) content on device 2400. Additionally, a docking connector can allow device 2400 to connect to certain peripherals that allow computing device 2400 to control content output, for example, to audiovisual or other systems.

In addition to a proprietary docking connector or other proprietary connection hardware, device 2400 can make peripheral connections via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, connectivity circuitries 2431 may be coupled to control hub 2432, e.g., in addition to, or instead of, being coupled directly to the processor 2404. In some embodiments, display 2422 may be coupled to control hub 2432, e.g., in addition to, or instead of, being coupled directly to processor 2404.

In some embodiments, device 2400 comprises memory 2430 coupled to processor 2404 via memory interface 2434. Memory 2430 includes memory devices for storing information in device 2400.

In some embodiments, memory 2430 includes apparatus to maintain stable clocking as described with reference to various embodiments. Memory can include nonvolatile (state does not change if power to the memory device is interrupted) and/or volatile (state is indeterminate if power to the memory device is interrupted) memory devices. Memory device 2430 can be a dynamic random access memory (DRAM) device, a static random access memory (SRAM) device, flash memory device, phase-change memory device, or some other memory device having suitable performance to serve as process memory. In one embodiment, memory 2430 can operate as system memory for device 2400, to store data and instructions for use when the one or more processors 2404 executes an application or process. Memory 2430 can store application data, user data, music, photos, documents, or other data, as well as system data (whether long-term or temporary) related to the execution of the applications and functions of device 2400.

Elements of various embodiments and examples are also provided as a machine-readable medium (e.g., memory 2430) for storing the computer-executable instructions (e.g., instructions to implement any other processes discussed herein). The machine-readable medium (e.g., memory 2430) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, device 2400 comprises temperature measurement circuitries 2440, e.g., for measuring temperature of various components of device 2400. In an example, temperature measurement circuitries 2440 may be embedded, or coupled or attached to various components, whose temperature are to be measured and monitored. For example, temperature measurement circuitries 2440 may measure temperature of (or within) one or more of cores 2408*a*, 2408*b*, 2408*c*, voltage regulator 2414, memory 2430, a mother-board of SOC 2401, and/or any appropriate component of device 2400.

In some embodiments, device 2400 comprises power measurement circuitries 2442, e.g., for measuring power consumed by one or more components of the device 2400. In an example, in addition to, or instead of, measuring power, the power measurement circuitries 2442 may measure voltage and/or current. In an example, the power measurement circuitries 2442 may be embedded, or coupled or attached to various components, whose power, voltage, and/or current consumption are to be measured and monitored. For example, power measurement circuitries 2442 may measure power, current and/or voltage supplied by one or more voltage regulators 2414, power supplied to SOC 2401, power supplied to device 2400, power consumed by processor 2404 (or any other component) of device 2400, etc.

In some embodiments, device 2400 comprises one or more voltage regulator circuitries, generally referred to as voltage regulator (VR) 2414. VR 2414 generates signals at appropriate voltage levels, which may be supplied to operate any appropriate components of the device 2400. Merely as an example, VR 2414 is illustrated to be supplying signals to processor 2404 of device 2400. In some embodiments, VR 2414 receives one or more Voltage Identification (VID) signals, and generates the voltage signal at an appropriate level, based on the VID signals. Various type of VRs may be utilized for the VR 2414. For example, VR 2414 may include a "buck" VR, "boost" VR, a combination of buck and boost VRs, low dropout (LDO) regulators, switching DC-DC regulators, constant-on-time controller based DC-DC regulator, etc. Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity. In some embodiments, each processor core has its own VR, which is controlled by PCU 2410*a/b* and/or PMIC 2412. In some embodiments, each core has a network of distributed LDOs to provide efficient control for power management. The LDOs can be digital, analog, or a combination of digital or analog LDOs. In some embodiments, VR 2414 includes current tracking apparatus to measure current through power supply rail(s).

In some embodiments, device 2400 comprises one or more clock generator circuitries, generally referred to as clock generator 2416. Clock generator 2416 generates clock signals at appropriate frequency levels, which may be supplied to any appropriate components of device 2400. Merely as an example, clock generator 2416 is illustrated to be supplying clock signals to processor 2404 of device 2400. In some embodiments, clock generator 2416 receives one or more Frequency Identification (FID) signals, and generates the clock signals at an appropriate frequency, based on the FID signals.

In some embodiments, device 2400 comprises battery 2418 supplying power to various components of device 2400. Merely as an example, battery 2418 is illustrated to be supplying power to processor 2404. Although not illustrated in the figures, device 2400 may comprise a charging circuitry, e.g., to recharge the battery, based on Alternating Current (AC) power supply received from an AC adapter.

In some embodiments, device 2400 comprises Power Control Unit (PCU) 2410 (also referred to as Power Management Unit (PMU), Power Controller, etc.). In an example, some sections of PCU 2410 may be implemented by one or more processing cores 2408, and these sections of PCU 2410 are symbolically illustrated using a dotted box and labelled PCU 2410*a*. In an example, some other sections of PCU 2410 may be implemented outside the processing cores 2408, and these sections of PCU 2410 are symbolically illustrated using a dotted box and labelled as PCU 2410*b*. PCU 2410 may implement various power management operations for device 2400. PCU 2410 may include hardware interfaces, hardware circuitries, connectors, registers, etc., as well as software components (e.g., drivers, protocol stacks), to implement various power management operations for device 2400.

In some embodiments, device 2400 comprises Power Management Integrated Circuit (PMIC) 2412, e.g., to implement various power management operations for device 2400. In some embodiments, PMIC 2412 is a Reconfigurable Power Management ICs (RPMICs) and/or an IMVP (Intel® Mobile Voltage Positioning). In an example, the PMIC is within an IC chip separate from processor 2404. The may implement various power management operations for device 2400. PMIC 2412 may include hardware interfaces, hardware circuitries, connectors, registers, etc., as well as software components (e.g., drivers, protocol stacks), to implement various power management operations for device 2400.

In an example, device 2400 comprises one or both PCU 2410 or PMIC 2412. In an example, any one of PCU 2410 or PMIC 2412 may be absent in device 2400, and hence, these components are illustrated using dotted lines.

Various power management operations of device 2400 may be performed by PCU 2410, by PMIC 2412, or by a combination of PCU 2410 and PMIC 2412. For example, PCU 2410 and/or PMIC 2412 may select a power state (e.g., P-state) for various components of device 2400. For example, PCU 2410 and/or PMIC 2412 may select a power state (e.g., in accordance with the ACPI (Advanced Configuration and Power Interface) specification) for various components of device 2400. Merely as an example, PCU 2410 and/or PMIC 2412 may cause various components of the device 2400 to transition to a sleep state, to an active state, to an appropriate C state (e.g., C0 state, or another appropriate C state, in accordance with the ACPI specification), etc. In an example, PCU 2410 and/or PMIC 2412 may control a voltage output by VR 2414 and/or a frequency of a clock signal output by the clock generator, e.g., by outputting the VID signal and/or the FID signal, respectively. In an example, PCU 2410 and/or PMIC 2412 may control battery power usage, charging of battery 2418, and features related to power saving operation.

The clock generator 2416 can comprise a phase locked loop (PLL), frequency locked loop (FLL), or any suitable clock source. In some embodiments, each core of processor 2404 has its own clock source. As such, each core can operate at a frequency independent of the frequency of operation of the other core. In some embodiments, PCU 2410 and/or PMIC 2412 performs adaptive or dynamic frequency scaling or adjustment. For example, clock frequency of a processor core can be increased if the core is not operating at its maximum power consumption threshold or limit. In some embodiments, PCU 2410 and/or PMIC 2412 determines the operating condition of each core of a processor, and opportunistically adjusts frequency and/or power supply voltage of that core without the core clocking source (e.g., PLL of that core) losing lock when the PCU 2410 and/or PMIC 2412 determines that the core is operating below a target performance level. For example, if a core is drawing current from a power supply rail less than a total current allocated for that core or processor 2404, then PCU 2410 and/or PMIC 2412 can temporality increase the power draw for that core or processor 2404 (e.g., by increasing clock frequency and/or power supply voltage level) so that the core or processor 2404 can perform at higher performance level. As such, voltage and/or frequency can be increased temporality for processor 2404 without violating product reliability.

In an example, PCU 2410 and/or PMIC 2412 may perform power management operations, e.g., based at least in part on receiving measurements from power measurement circuitries 2442, temperature measurement circuitries 2440, charge level of battery 2418, and/or any other appropriate information that may be used for power management. To that end, PMIC 2412 is communicatively coupled to one or more sensors to sense/detect various values/variations in one or more factors having an effect on power/thermal behavior of the system/platform. Examples of the one or more factors include electrical current, voltage droop, temperature, operating frequency, operating voltage, power consumption, inter-core communication activity, etc. One or more of these sensors may be provided in physical proximity (and/or thermal contact/coupling) with one or more components or logic/IP blocks of a computing system. Additionally, sensor(s) may be directly coupled to PCU 2410 and/or PMIC 2412 in at least one embodiment to allow PCU 2410 and/or PMIC 2412 to manage processor core energy at least in part based on value(s) detected by one or more of the sensors.

Also illustrated is an example software stack of device 2400 (although not all elements of the software stack are illustrated). Merely as an example, processors 2404 may execute application programs 2450, Operating System 2452, one or more Power Management (PM) specific application programs (e.g., generically referred to as PM applications 2458), and/or the like. PM applications 2458 may also be executed by the PCU 2410 and/or PMIC 2412. OS 2452 may also include one or more PM applications 2456*a*, 2456*b*, 2456*c*. The OS 2452 may also include various drivers 2454*a*, 2454*b*, 2454*c*, etc., some of which may be specific for power management purposes. In some embodiments, device 2400 may further comprise a Basic Input/Output System (BIOS) 2420. BIOS 2420 may communicate with OS 2452 (e.g., via one or more drivers 2454), communicate with processors 2404, etc.

For example, one or more of PM applications 2458, 2456, drivers 2454, BIOS 2420, etc. may be used to implement power management specific tasks, e.g., to control voltage and/or frequency of various components of device 2400, to control wake-up state, sleep state, and/or any other appropriate power state of various components of device 2400, control battery power usage, charging of the battery 2418, features related to power saving operation, etc.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

Various embodiments described herein are illustrated as examples. The features of these examples can be combined with one another in any suitable way. For instance, example 4 can be combined with example 2 or 6. These examples include:

Example 1: An apparatus comprising: an n-type high-side field effect transistor (HSFET) coupled to a first power supply rail and an inductor; an n-type low-side field effect transistor (LSFET) coupled in series with the HSFET and coupled to a second supply rail; a first driver to drive the HSFET, the first driver powered via a third supply rail, and coupled to the inductor; a second driver to drive the LSFET, the second driver powered via a fourth supply rail, and coupled to the second supply rail; and a bootstrap circuit including: a capacitor coupled to the inductor and the third supply rail; and a switch coupled to the capacitor and the fourth supply rail.

Example 2: The apparatus of example 1, wherein the fourth supply rail is to provide a fourth supply voltage which is derived from a first supply voltage supplied by the first power supply rail.

Example 3: The apparatus of example 2 comprising a supply generator to derive the fourth supply voltage from the first supply voltage.

Example 4: The apparatus of example 3, wherein the supply generator comprises an open loop supply generator.

Example 5: The apparatus of example 3, wherein the supply generator comprises a closed loop supply generator.

Example 6: The apparatus of example 1, wherein the switch is a five terminal transistor.

Example 7: The apparatus of example 1, wherein the switch comprises: a source terminal coupled to the fourth supply rail; a drain terminal coupled to the third supply rail; a substrate terminal coupled to a ground supply rail; and a bulk terminal coupled to a dynamic biasing circuitry.

Example 8: The apparatus of example 7, wherein the switch is a first switch, wherein the dynamic biasing circuitry comprises: a second switch coupled to the bulk terminal and the third supply rail; and a third switch coupled to the bulk terminal and a pair of cross-coupled transistors.

Example 9: The apparatus of example 8, wherein the cross-coupled transistors include: a first transistor including: a source terminal coupled to the third switch; a gate terminal coupled to the third supply rail; and a drain terminal coupled to the ground supply rail; and a second transistor including: a source terminal coupled to the third switch; a gate terminal coupled to the ground supply rail; and a drain terminal coupled to third supply rail.

Example 10: The apparatus of example 8, wherein the first and second switches are controllable by a control, and wherein the third switch is controllable by an inverse of the control.

Example 11: The apparatus of example 1, wherein the first supply rail is an input supply rail, and wherein the second supply rail is an output supply rail.

Example 12: The apparatus of example 1, wherein the inductor is coupled to a low supply rail of the first driver.

Example 13: The apparatus of example 1, wherein the second supply rail is coupled to a low supply rail of the second driver.

Example 14: The apparatus of example 1 comprising a load capacitor coupled to the inductor, a ground supply rail, and the second supply rail.

Example 15: An apparatus comprising: an n-type high-side switch coupled to a first power supply rail and an inductor; an n-type low-side switch coupled in series with the n-type high-side switch and coupled to a second supply rail, which is to provide an output power supply; a driver to drive the n-type high-side switch, the driver powered via a third supply rail, and coupled to the inductor; a bootstrap circuit including: a capacitor coupled to the inductor and the third supply rail; and a switch coupled to the capacitor and a fourth supply rail which is to provide a power supply derived from the output power supply.

Example 16: The apparatus of example 15, wherein the switch comprises: a source terminal coupled to the fourth supply rail; a drain terminal coupled to the third supply rail; a substrate terminal coupled to a ground supply rail; and a bulk terminal coupled to a dynamic biasing circuitry.

Example 17: An apparatus comprising: a three-dimensional cross-point memory; and a power management integrated circuit (PMIC) including a buck-boost DC-DC converter, wherein the buck-boost DC-DC converter is to provide a power supply to the three-dimensional cross-point memory, wherein the buck-boost DC-DC converter comprises: an n-type high-side field effect transistor (HSFET) coupled to a first power supply rail and an inductor; an n-type low-side field effect transistor (LSFET) coupled in series with the HSFET and coupled to a second supply rail which is to provide the power supply to the three-dimensional cross-point memory; a first driver to drive the HSFET, the first driver powered via a third supply rail, and coupled to the inductor; a second driver to drive the LSFET, the second driver powered via a fourth supply rail, and coupled to the second supply rail; and a bootstrap circuit including: a capacitor coupled to the inductor and the third supply rail; and a switch coupled to the capacitor and the fourth supply rail.

Example 18: The apparatus of example 17, wherein the switch is a five terminal transistor.

Example 19: The apparatus of example 17, wherein the switch comprises: a source terminal coupled to the fourth supply rail; a drain terminal coupled to the third supply rail; a substrate terminal coupled to a ground supply rail; and a bulk terminal coupled to a dynamic biasing circuitry.

Example 20: The apparatus of example 19, wherein the switch is a first switch, wherein the dynamic biasing circuitry comprises: a second switch coupled to the bulk terminal and the third supply rail; and a third switch coupled to the bulk terminal and a pair of cross-coupled transistors.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus comprising:
    an n-type high-side field effect transistor (HSFET) coupled to a first power supply rail and an inductor;
    an n-type low-side field effect transistor (LSFET) coupled in series with the HSFET and coupled to a second supply rail;
    a first driver to drive the HSFET, the first driver powered via a third supply rail and coupled to the inductor;
    a second driver to drive the LSFET, the second driver powered via a fourth supply rail and coupled to the second supply rail; and
    a bootstrap circuit including:
        a capacitor coupled to the inductor and the third supply rail; and
        a switch coupled to the capacitor and the fourth supply rail, wherein the switch is a five-terminal transistor.

2. The apparatus of claim 1, wherein the fourth supply rail is to provide a fourth supply voltage which is derived from a first supply voltage supplied by the first power supply rail.

3. The apparatus of claim 2, further comprising a supply generator to derive the fourth supply voltage from the first supply voltage.

4. The apparatus of claim 3, wherein the supply generator comprises an open-loop supply generator.

5. The apparatus of claim 3, wherein the supply generator comprises a closed-loop supply generator.

6. The apparatus of claim 1, wherein the switch comprises:
    a source terminal coupled to the fourth supply rail;
    a drain terminal coupled to the third supply rail;
    a substrate terminal coupled to a ground supply rail; and
    a bulk terminal coupled to a dynamic biasing circuitry.

7. The apparatus of claim 6, wherein the switch is a first switch, wherein the dynamic biasing circuitry comprises:
    a second switch coupled to the bulk terminal and the third supply rail; and
    a third switch coupled to the bulk terminal and a pair of cross-coupled transistors.

8. The apparatus of claim 7, wherein the cross-coupled transistors include:
    a first transistor including:
        a source terminal coupled to the third switch;
        a gate terminal coupled to the third supply rail; and
        a drain terminal coupled to the ground supply rail; and
    a second transistor including:
        a source terminal coupled to the third switch;
        a gate terminal coupled to the ground supply rail; and
        a drain terminal coupled to the third supply rail.

9. The apparatus of claim 7, wherein the first and second switches are controllable by a control, and wherein the third switch is controllable by an inverse of the control.

10. The apparatus of claim 1, wherein the first supply rail is an input supply rail, and wherein the second supply rail is an output supply rail.

11. The apparatus of claim 1, wherein the inductor is coupled to a low supply rail of the first driver.

12. The apparatus of claim 1, wherein the second supply rail is coupled to a low supply rail of the second driver.

13. The apparatus of claim 1, further comprising a load capacitor coupled to the inductor, a ground supply rail, and the second supply rail.

14. An apparatus comprising:
    an n-type high-side switch coupled to a first power supply rail and an inductor;
    an n-type low-side switch coupled in series with the n-type high-side switch and coupled to a second supply rail, which is to provide an output power supply;
    a driver to drive the n-type high-side switch, the driver powered via a third supply rail and coupled to the inductor; and
    a bootstrap circuit including:
        a capacitor coupled to the inductor and the third supply rail; and a switch coupled to the capacitor and a fourth supply rail which is to provide a power supply derived from the output power supply, wherein the switch comprises:
a source terminal coupled to the fourth supply rail;
a drain terminal coupled to the third supply rail;
a substrate terminal coupled to a ground supply rail; and
a bulk terminal coupled to a dynamic biasing circuitry.

15. The apparatus of claim 14, wherein the switch is a first switch, wherein the dynamic biasing circuitry comprises:
a second switch coupled to the bulk terminal and the third supply rail; and
a third switch coupled to the bulk terminal and a pair of cross-coupled transistors.

16. The apparatus of claim 15, wherein the cross-coupled transistors include:
a first transistor including:
a source terminal coupled to the third switch;
a gate terminal coupled to the third supply rail; and
a drain terminal coupled to the ground supply rail; and
a second transistor including:
a source terminal coupled to the third switch;
a gate terminal coupled to the ground supply rail; and
a drain terminal coupled to third supply rail.

17. The apparatus of claim 15, wherein the first and second switches are controllable by a control, and wherein the third switch is controllable by an inverse of the control.

18. An apparatus comprising:
a three-dimensional cross-point memory; and
a power management integrated circuit (PMIC) including a buck-boost DC-DC converter, wherein the buck-boost DC-DC converter is to provide a power supply to the three-dimensional cross-point memory, wherein the buck-boost DC-DC converter comprises:
an n-type high-side field effect transistor (HSFET) coupled to a first power supply rail and an inductor;
an n-type low-side field effect transistor (LSFET) coupled in series with the HSFET and coupled to a second supply rail which is to provide the power supply to the three-dimensional cross-point memory;
a first driver to drive the HSFET, the first driver powered via a third supply rail and coupled to the inductor;
a second driver to drive the LSFET, the second driver powered via a fourth supply rail and coupled to the second supply rail; and
a bootstrap circuit including:
a capacitor coupled to the inductor and the third supply rail; and
a switch coupled to the capacitor and the fourth supply rail, wherein the switch is a five-terminal transistor.

19. The apparatus of claim 18, wherein the switch comprises:
a source terminal coupled to the fourth supply rail;
a drain terminal coupled to the third supply rail;
a substrate terminal coupled to a ground supply rail; and
a bulk terminal coupled to a dynamic biasing circuitry.

20. The apparatus of claim 19, wherein the switch is a first switch, wherein the dynamic biasing circuitry comprises:
a second switch coupled to the bulk terminal and the third supply rail; and
a third switch coupled to the bulk terminal and a pair of cross-coupled transistors.

* * * * *

UNITED STATES PATENT AND TRADEMARK OFFICE
CERTIFICATE OF CORRECTION

PATENT NO. : 11,658,572 B2
APPLICATION NO. : 17/124359
DATED : May 23, 2023
INVENTOR(S) : Nikunj Gandhi et al.

Page 1 of 1

It is certified that error appears in the above-identified patent and that said Letters Patent is hereby corrected as shown below:

In the Claims

Column 25
Line 26 "...coupled to third supply rail." should read -- coupled to the third supply rail. --

Signed and Sealed this
Twenty-fifth Day of June, 2024

Katherine Kelly Vidal
*Director of the United States Patent and Trademark Office*